United States Patent
Bai et al.

(10) Patent No.: US 8,252,655 B2
(45) Date of Patent: Aug. 28, 2012

(54) METHOD OF FORMING SEMICONDUCTOR CELL STRUCTURE, METHOD OF FORMING SEMICONDUCTOR DEVICE INCLUDING THE SEMICONDUCTOR CELL STRUCTURE, AND METHOD OF FORMING SEMICONDUCTOR MODULE INCLUDING THE SEMICONDUCTOR DEVICE

(75) Inventors: Keun-Hee Bai, Suwon-si (KR);
Chul-Ho Shin, Yongin-si (KR);
Shin-Hye Kim, Suwon-si (KR);
Sang-Kuk Kim, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 80 days.

(21) Appl. No.: 12/801,013

(22) Filed: May 17, 2010

(65) Prior Publication Data

US 2011/0143532 A1   Jun. 16, 2011

(30) Foreign Application Priority Data

Dec. 14, 2009   (KR) .......................... 10-2009-0124211

(51) Int. Cl.
*H01L 21/8228*   (2006.01)

(52) U.S. Cl. ........................................................ 438/325

(58) Field of Classification Search ................... 438/325
See application file for complete search history.

(56) References Cited

U.S. PATENT DOCUMENTS

| 4,322,883 A * | 4/1982 | Abbas et al. ................... 438/325 |
| 4,379,001 A * | 4/1983 | Sakai et al. .................... 438/365 |
| 5,459,094 A * | 10/1995 | Jun ................................ 438/254 |
| 6,759,704 B2 | 7/2004 | Park |
| 2005/0161720 A1 * | 7/2005 | Park ................................ 257/296 |

FOREIGN PATENT DOCUMENTS

| KR | 10-0450671 | 9/2004 |
| KR | 1020090016813 | 2/2009 |
| KR | 1020090043326 | 5/2009 |

\* cited by examiner

*Primary Examiner* — Charles Garber
*Assistant Examiner* — Andre' C Stevenson
(74) *Attorney, Agent, or Firm* — Harness, Dickey & Pierce, P.L.C.

(57) ABSTRACT

In a method of forming a semiconductor cell structure, a first insulating layer may be formed on a semiconductor substrate. A connection pattern may be formed in the first insulating layer. Second and third insulating layers may be sequentially formed on the connection pattern. The third insulating layer may be etched at least twice and the second insulating layer may be etched at least once to form a through hole in the second and third insulating layers. The through hole may expose the connection pattern.

20 Claims, 15 Drawing Sheets

METHOD OF FORMING SEMICONDUCTOR CELL STRUCTURE, METHOD OF FORMING SEMICONDUCTOR DEVICE INCLUDING THE SEMICONDUCTOR CELL STRUCTURE, AND METHOD OF FORMING SEMICONDUCTOR MODULE INCLUDING THE SEMICONDUCTOR DEVICE

CROSS-REFERENCE TO RELATED APPLICATION

This application claims the benefit of priority under 35 U.S.C. §119 to Korean Patent Application No. 10-2009-0124211, filed on Dec. 14, 2009, the contents of which are hereby incorporated herein by reference in its entirety.

BACKGROUND

1. Field

Example embodiments relate to a method of forming a semiconductor cell structure, a method of forming a semiconductor device including the semiconductor cell structure, and a method of forming a semiconductor module including the semiconductor device.

2. Description of Related Art

A method of fabricating a semiconductor cell structure on a semiconductor substrate includes reducing a thickness of a stacked layer and a distance between conductive patterns based on shrinkage of a design rule of a semiconductor device. The stacked layer may insulate the conductive layers from each other or support the conductive layers. The conductive patterns may be disposed in the stacked layer to provide a transmission path of an internal or external electrical signal of the semiconductor device. In such a case, the stacked layer may have a lower insulating layer and an upper insulating layer. The lower insulating layer may expose a portion of the conductive patterns and cover the remainder thereof.

The upper insulating layer may be formed on the lower insulating layer and the conductive patterns. The upper insulating layer may have through holes exposing the portion of the conductive patterns. The through holes may be filled with electric nodes. However, diameters of the through holes may shrink according to continuous reduction in the distance between the conductive patterns. The electric nodes may have greater contact resistance with respect to the portion of the conductive patterns through the through holes compared with before the shrink design rule of the semiconductor device. The electric nodes may have a greater internal resistance compared with before the shrink design rule of the semiconductor device.

Furthermore, the through holes may pass the upper insulating layer to extend towards the lower insulating layer. The electric node may be electrically short-circuited with the remainder of the conductive patterns through the through holes. As a result, the semiconductor cell structure may deteriorate electrical characteristics of the semiconductor device compared with before the shrink design rule of the semiconductor device. The semiconductor device may be disposed in a semiconductor module and a processor-based system. The semiconductor module and the processor-based system may have degraded electrical characteristics due to the semiconductor device.

SUMMARY

The present invention provides a method of forming a semiconductor cell structure capable of stably enlarging diameters of through holes disposed on a lower insulating layer and passing an upper insulating layer.

The present invention also provides a method of forming a semiconductor cell structure that does not expose conductive patterns in a lower insulating layer to through holes surrounded by an upper insulating layer.

The present invention provides a method of forming a semiconductor device and a method of forming a semiconductor module, which are capable of improving electrical characteristics by using the semiconductor cell structure. The present invention also provides an etch stopping layer disposed on the lower insulating layer and in the upper insulating layer, and the etch stopping layer having a different etch rate from the lower insulating layer and the remaining upper insulating layer.

According to an example embodiment, a method of forming a semiconductor cell structure may include forming first and second patterns over a semiconductor substrate. Forming each of the first and second patterns may include sequentially stacking a conductive pattern and a mask pattern. A first insulating layer may be formed to surround the first and second patterns. A connection pattern may be formed in the first insulating layer to be located in a region between the first and second patterns. Second and third insulating layers may be sequentially formed on the connection pattern. The third insulating layer may be etched at least twice and the second insulating layer at least once to form a through hole. The through hole may be surrounded by at least one of the second and third insulating layers.

According to an example embodiment, the mask pattern may include silicon and nitrogen. The first insulating layer may include silicon and oxygen. The second insulating layer may include aluminum and nitrogen and be formed to cover the first and second patterns, the connection pattern and the first insulating layer. The third insulating layer may include an insulating material having a concentration gradient of impurity ions along a thickness direction perpendicular to a top surface thereof. The conductive pattern and the connection pattern may include conductive material.

According to an example embodiment, the etching the third insulating layer at least twice and the second insulating layer at least once to form a through hole step may include forming a photoresist layer on the third insulating layer. The photoresist layer may have an opening aligning the connection pattern and exposing the third insulating layer. The third insulating layer may be etched through the opening using the photoresist layer as an etch mask to form a first preliminary through hole in the third insulating layer. The first preliminary through hole may have substantially a same diameter along the thickness direction perpendicular to the top surface of the third insulating layer. The first preliminary through hole may expose the second insulating layer. The photoresist layer may be removed from the semiconductor substrate. A lower portion of the third insulating layer may be etched through the first preliminary through hole using the third insulating layer as an etch mask to form a second preliminary through hole. The second preliminary through hole may have a diameter D2 in the lower portion of the third insulating layer, and a diameter D1 in an upper portion of the third insulating layer, wherein D2>D1. The second insulating layer may be etched through the second preliminary through hole using the third insulating layer as an etch mask to form the through hole exposing the connection pattern.

According to an example embodiment, the mask pattern may include silicon and nitrogen. The first insulating layer may include silicon and oxygen. The second insulating layer may include aluminum and nitrogen, and be formed to cover the connection pattern. The third insulating layer may include an insulating material having a concentration gradient of impurity ions along a thickness direction perpendicular to a top surface thereof. The conductive pattern and the connection pattern may include conductive material.

According to an example embodiment, the etching the third insulating layer at least twice and the second insulating layer at least once to form a through hole step may include forming a photoresist layer on the third insulating layer. The photoresist layer may have an opening aligning the connection pattern and exposing the third insulating layer. The third insulating layer may be etched through the opening using the photoresist layer as an etch mask to form a first preliminary through hole in the third insulating layer. The first preliminary through hole may have substantially a same diameter along a thickness direction perpendicular to the top surface of the third insulating layer, and the first preliminary through hole may expose the second insulating layer. The photoresist layer may be removed from the semiconductor substrate. A lower portion of the third insulating layer may be etched through the first preliminary through hole using the third insulating layer as an etch mask to form a second preliminary through hole. The second preliminary through hole may have a diameter D2 in the lower portion of the third insulating layer, and a diameter D1 in an upper portion of the third insulating layer, wherein D2>D1. The second insulating layer may be etched through the second preliminary through hole using the third insulating layer as an etch mask to form the through hole exposing the connection pattern.

According to an example embodiment, a method of forming a semiconductor device may comprise forming an active region in a semiconductor substrate. First and second patterns may be formed over the active region to pass the active region. Forming each of the first and second patterns may include sequentially stacking a conductive pattern and a mask pattern. A first insulating layer may be formed around the first and second patterns to expose the first and second patterns. A connection pattern may be formed in the first insulating layer to be located in a region between the first and second patterns. The connection pattern may be electrically connected to the active region. Second and third insulating layers may be sequentially formed on the connection pattern. The third insulating layer may be etched at least twice and the second insulating layer at least once to form a through hole. The connection pattern may be surrounded by at least one of the second and third insulating layers. The first to third insulating layers may have different etch rates from each other. The second insulating layer may be formed from different material from the mask pattern.

According to an example embodiment, the mask pattern includes one of aluminum and silicon, and nitrogen. The first insulating layer includes silicon and oxygen. The second insulating layer includes one of aluminum and silicon, and nitrogen, and is formed to cover the first and second patterns, the connection pattern and the first insulating layer. The conductive pattern and the connection pattern include conductive material.

According to an example embodiment, The third insulating layer may include one of a first insulating material having a concentration gradient of impurity ions along a thickness direction perpendicular to a top surface thereof, and second insulating materials stacked sequentially toward the top surface thereof, and the third insulating layer may have a greater etch rate at a lower portion of the third insulating layer than an upper portion thereof.

According to an example embodiment, the etching the third insulating layer at least twice sand the second insulating layer at least once to form a through hole step may include forming a photoresist layer on the third insulating layer. The photoresist layer may have an opening aligning the connection pattern and exposing the third insulating layer. The third insulating layer may be etched through the opening using the photoresist layer as an etch mask to form a first preliminary through hole in the third insulating layer. The first preliminary through hole may have substantially a same diameter along a thickness direction perpendicular to the top surface of the third insulating layer, and the first preliminary through hole may expose the second insulating layer. The photoresist layer may be removed from the semiconductor substrate. A lower portion of the third insulating layer may be etched through the first preliminary through hole using the third insulating layer as an etch mask to form a second preliminary through hole. The second preliminary through hole may have a diameter D2 in the lower portion of the third insulating layer, and a diameter D1 in an upper portion of the third insulating layer, wherein D2>D1. The second insulating layer may be etched through the second preliminary through hole using the third insulating layer as an etch mask to form the through hole exposing the connection pattern.

According to an example embodiment, the first preliminary through hole may be formed by applying a dry etchant to the third insulating layer. The second preliminary through hole may be formed by applying one selected from wet and dry etchants to the third insulating layer. The through hole may be formed by applying one selected from wet and dry etchants to the second insulating layer.

According to an example embodiment, the wet etchant applied to the second insulating layer may include one of $H_2SO_4$, $H_3PO_4$, and SC-1 or a combination of $H_2SO_4$ and SC-1. According to an example embodiment, the mask pattern may include one of aluminum and silicon, and nitrogen. The first insulating layer may include silicon and oxygen. The second insulating layer may include one of aluminum and silicon, and nitrogen, and be formed to cover the connection pattern. The conductive pattern and the connection pattern include conductive material.

According to an example embodiment, the third insulating layer may include one of a first insulating material having a concentration gradient of impurity ions along a thickness direction perpendicular to a top surface thereof, and second insulating materials stacked sequentially toward the top surface thereof, and the third insulating layer may have a greater etch rate at a lower portion of the third insulating layer than an upper portion thereof.

According to an example embodiment, the etching the third insulating layer at least twice and the second insulating layer at least once to form a through hole step may include forming a photoresist layer on the third insulating layer. The photoresist layer may have an opening aligning the connection pattern and exposing the third insulating layer. The third insulating layer may be etched through the opening using the photoresist layer as an etch mask to form a first preliminary through hole in the third insulating layer. The first preliminary through hole may have substantially a same diameter along a thickness direction perpendicular to the top surface of the third insulating layer, and the first preliminary through hole may expose the second insulating layer. The photoresist layer may be removed from the semiconductor substrate. A lower portion of the third insulating layer may be etched through the first preliminary through hole using the third insulating layer as an etch mask to form a second preliminary through hole. The second preliminary through hole may have a diameter D2 in the lower portion of the third insulating layer, and a diameter D1 in an upper portion of the third insulating layer, wherein D2>D1. The second insulating layer may be etched through the second preliminary through hole using the third insulating layer as an etch mask to form the through hole exposing the connection pattern.

According to an example embodiment, the first preliminary through hole may be formed by applying a dry etchant to the third insulating layer. The second preliminary through hole may be formed by applying one selected from wet and dry etchants to the third insulating layer. The through hole may be formed by applying a dry etchant to the second insulating layer including one of $H_2SO_4$, $H_3PO_4$, and SC-1 or a combination of $H_2SO_4$ and SC-1.

According to an example embodiment, a method of forming a semiconductor module may comprise preparing a module substrate and at least one semiconductor package structure. The module substrate may be electrically connected to the at least one semiconductor package structure. The at least one semiconductor package structure may have a semiconductor device. The semiconductor device may be formed by using the method of forming a semiconductor cell structure including forming first and second patterns over a semiconductor substrate. Forming each of the first and second patterns may include sequentially stacking a conductive pattern and a mask pattern. A first insulating layer may be formed to surround the first and second patterns. A connection pattern may be formed in the first insulating layer in a region between the first and second patterns. Second and third insulating layers may be sequentially formed on the connection pattern. The third insulating layer may be etched at least twice and the second insulating layer at least once to form a through hole. The through hole may be surrounded by at least one of the second and third insulating layers.

According to an example embodiment, the mask pattern may include silicon and nitrogen. The first insulating layer may include silicon and oxygen. The second insulating layer may include aluminum and nitrogen, and be formed to cover first and second patterns, the connection pattern, and the first insulating layer. The third insulating layer may include an insulating material having a concentration gradient of impurity ions along a thickness direction perpendicular to a top surface thereof. The conductive pattern and the connection pattern may include conductive material.

According to an example embodiment, the etching the third insulating layer at least twice and the second insulating layer at least once to form a through hole step may include forming a photoresist layer on the third insulating layer. The photoresist layer may have an opening aligning the connection pattern and exposing the third insulating layer. The third insulating layer may be etched through the opening using the photoresist layer as an etch mask to form a first preliminary through hole in the third insulating layer. The first preliminary through hole may have substantially a same diameter along a thickness direction perpendicular to the top surface of the third insulating layer, and the first preliminary through hole may expose the second insulating layer. The photoresist layer may be removed from the semiconductor substrate. A lower portion of the third insulating layer may be etched through the first preliminary through hole using the third insulating layer as an etch mask to form a second preliminary through hole. The second preliminary through hole may have a diameter D2 in the lower portion of the third insulating layer, and a diameter D1 in an upper portion of the third insulating layer, wherein D2>D1. The second insulating layer may be etched through the second preliminary through hole using the third insulating layer as an etch mask to form the through hole exposing the connection pattern.

According to an example embodiment, the mask pattern may include silicon and nitrogen. The first insulating layer may include silicon and oxygen. The second insulating layer may include aluminum and nitrogen, and be formed to cover the connection pattern. The third insulating layer may include an insulating material having a concentration gradient of impurity ions along a thickness direction perpendicular to a top surface thereof. The conductive pattern and the connection pattern may include conductive material.

According to an example embodiment, the etching the third insulating layer at least twice and the second insulating layer at least once to form a through hole step may include forming a photoresist layer on the third insulating layer. The photoresist layer may have an opening aligning the connection pattern and exposing the third insulating layer. The third insulating layer may be etched through the opening using the photoresist layer as an etch mask to form a first preliminary through hole in the third insulating layer. The first preliminary through hole may have substantially a same diameter along a thickness direction perpendicular to the top surface of the third insulating layer, and the first preliminary through hole may expose the second insulating layer. The photoresist layer may be removed from the semiconductor substrate. A lower portion of the third insulating layer may be etched through the first preliminary through hole using the third insulating layer as an etch mask to form a second preliminary through hole. The second preliminary through hole may have a diameter D2 in the lower portion of the third insulating layer, and a diameter D1 in an upper portion of the third insulating layer, wherein D2>D1. The second insulating layer may be etched through the second preliminary through hole using the third insulating layer as an etch mask to form the through hole exposing the connection pattern.

BRIEF DESCRIPTION OF THE DRAWINGS

Example embodiments are described in further detail below with reference to the accompanying drawings. It should be understood that various aspects of the drawings may have been exaggerated for clarity.

DETAILED DESCRIPTION OF EXAMPLE EMBODIMENTS

Figure 1:
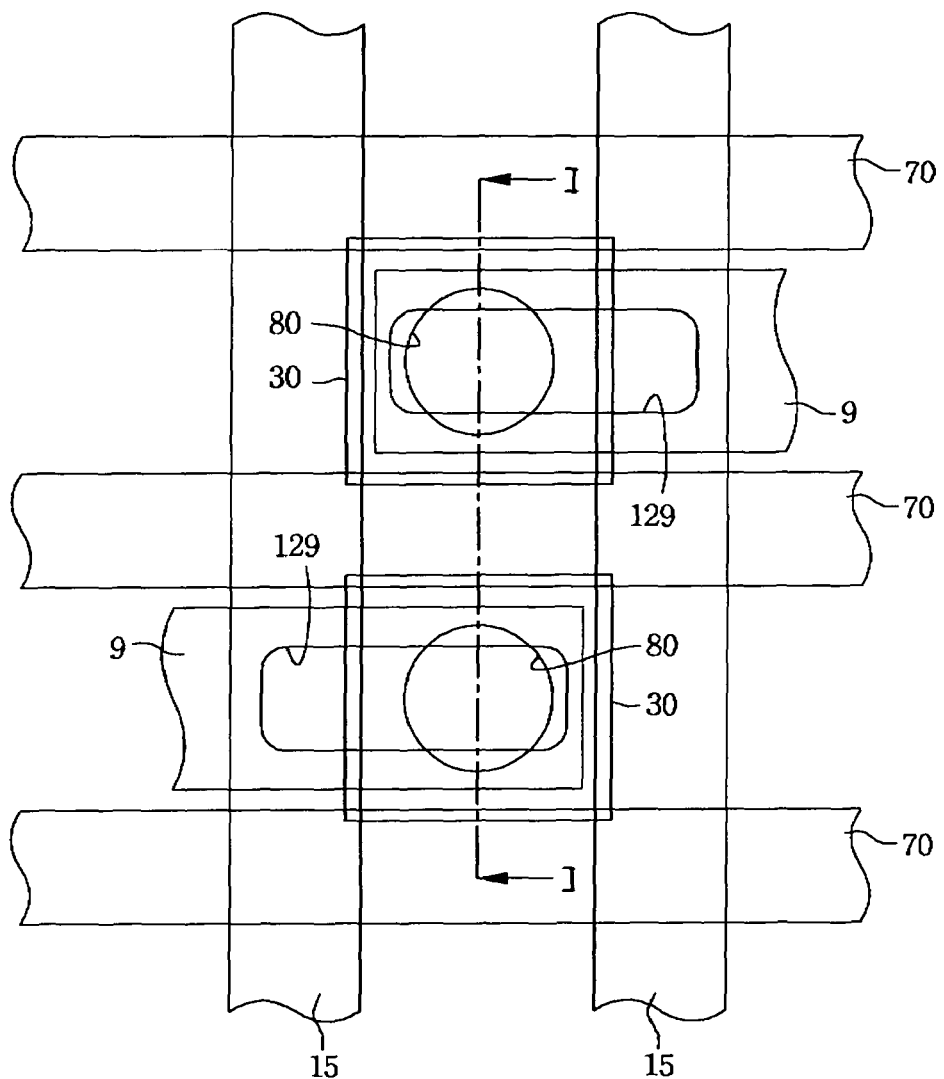
FIG. 1 is a plan view of a semiconductor cell structure according to an example embodiment.

Various example embodiments will now be described more fully with reference to the accompanying drawings in which some example embodiments are shown. This inventive concept may, however, be embodied in different forms and should not be construed as limited to the embodiments set forth herein. Rather, these embodiments are provided so that this disclosure is thorough and complete and fully conveys the scope of the inventive concept to one skilled in the art. In the drawings, the thickness of layers and regions may be exaggerated for clarity. Also, when it is referred that a layer is "on" another layer or a substrate, it may be directly formed on another layer or the substrate or a third layer may be interposed therebetween. Like reference numerals designate like elements throughout the specification.

It will be understood that when an element or layer is referred to as being "connected to" or "coupled to" another element or layer, it can be directly connected or coupled to the other element or layer or intervening elements or layers may be present. In contrast, when an element is referred to as being "directly connected to" or "directly coupled to" another element or layer, there are no intervening elements or layers present. Like reference numerals refer to like elements throughout the specification. As used herein, the term "and/or" includes any and all combinations of one or more of the associated listed items.

It will be understood that, although the terms first, second, third, etc., may be used herein to describe various elements, components and/or sections, these elements, components and/or sections should not be limited by these terms. These terms are only used to distinguish one element, component or section from another element, component or section. Thus, a first element, component or section discussed below could be termed a second element, component or section without departing from the teachings of the inventive concepts.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "includes", "including" and/or "comprising," when used in this specification, specify the presence of stated components, steps, operations, and/or elements, but do not preclude the presence or addition of one or more other components, steps, operations, elements, and/or groups thereof. As used herein, the term "and/or" includes any and all combinations of one or more of the associated listed items. Like numbers refer to like elements throughout.

Spatially relative terms, such as "below," "beneath," "lower," "above," "upper," and the like, may be used herein for ease of description to describe one device or element's relationship to another device(s) or element(s) as illustrated in the drawings. It will be understood that the spatially relative terms are intended to encompass different orientations of the device in use or operation in addition to the orientation depicted in the drawings.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A method of forming a semiconductor cell structure according to example embodiments will be described below with reference to the accompanying drawings. FIG. 1 is a plan view of a semiconductor cell structure according to an example embodiment.

Referring to FIG. 1, a semiconductor cell structure 140 according to an example embodiment may include first and second patterns 15 and 70. The first patterns 15 may be disposed to be parallel to each other along one direction in the semiconductor cell structure 140. The first patterns 15 may include a gate pattern or a pattern other than the gate pattern. The second patterns 70 may be disposed to be parallel to each other along the other direction in the semiconductor cell structure 140. The second patterns 70 may be disposed on the first patterns 15 to cross the first patterns 15.

The second patterns 70 may include a bit line pattern or a pattern other than the bit line pattern. Active regions 9 may be disposed between the first and second patterns 15 and 70. The active regions 9 may be partially exposed between the first and second patterns 15 and 70. The active regions 9 may cross the first patterns 15. Each of the active regions 9 may be electrically connected (not shown) to one of the adjacent two second patterns 70 or may not be electrically connected to the adjacent second patterns 70. Landing pads 30 may be disposed on the active regions 9.

The landing pads 30 may be disposed to partially expose the active regions 9. Each of the landing pads 30 may be disposed on an edge of each of the active regions 9. Second connection holes 80 may be disposed on the landing pads 30. The second connection holes 80 may be filled with connection patterns 85 of FIG. 4. Through holes 129 may overlap the second connection holes 80. The through holes 129 may be filled with plugs 134 of FIG. 12 or electric nodes 138 of FIG. 13.

As a variation of example embodiments, the semiconductor cell structure 140 may not have the first patterns 15 and the landing pads 30 on the active regions 9. In this case, the connection patterns 85 may be disposed in predetermined or given regions between the second patterns 70 to be in direct contact with the active regions 9.

Figure 2:
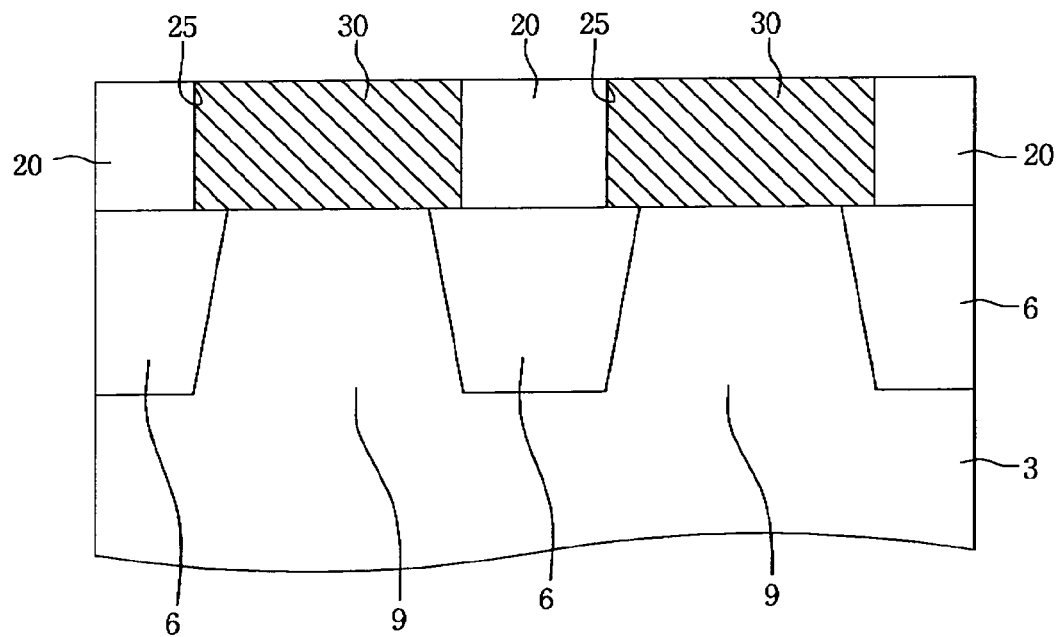
FIGS. 2 to 6 are cross-sectional views taken along line I-I' of FIG. 1, illustrating an intermediate step of a method of forming a semiconductor cell structure.

FIGS. 2 to 6 are cross-sectional views taken along line I-I' of FIG. 1, illustrating an intermediate step of a method of forming a semiconductor cell structure. Referring to FIG. 2, a semiconductor substrate 3 may be prepared according to example embodiments. The semiconductor substrate 3 may include a non-active region 6 and active regions 9. The non-active region 6 may be formed in the semiconductor substrate 3 to define the active regions 9. The non-active region 6 may be filled with a device isolation layer. The device isolation layer may include insulating material. The first patterns 15 of FIG. 1 may be formed on the non-active regions 6 and the active regions 9. The first patterns 15 may pass over the active regions 9 to be formed on the non-active regions 6.

A first insulating layer 20 may be formed on the non-active regions 6 and the active regions 9 to cover the first patterns 15. The first insulating layer 20 may include insulating material having the same etch rate as or a different etch rate from the device isolation layer. The first insulating layer 20 may be formed of silicon and oxygen. Photolithography and etch processes or only an etch process may be performed on the first insulating layer 20 to form first connection holes 25 in the first insulating layer 20. The first connection holes 25 may be formed in predetermined or given regions between the first patterns 15.

The first connection holes 25 may penetrate the first insulating layer 20 to expose the non-active regions 6 and the active regions 9 or only the active regions 9. Landing pads 30 may be formed in the first connection holes 25 to fill the first connection holes 25. The landing pads 30 may be in direct contact with the non-active region 6 and the active regions 9, or only the active regions 9. The landing pads 30 may include doped polysilicon, metal material, metal nitride, or stacked materials thereof. As a variation according to example embodiments, the first patterns 15, the first insulating layer 20 and the landing pads 30 may not be formed on the non-active regions 6 and the active regions 9.

Figure 3:
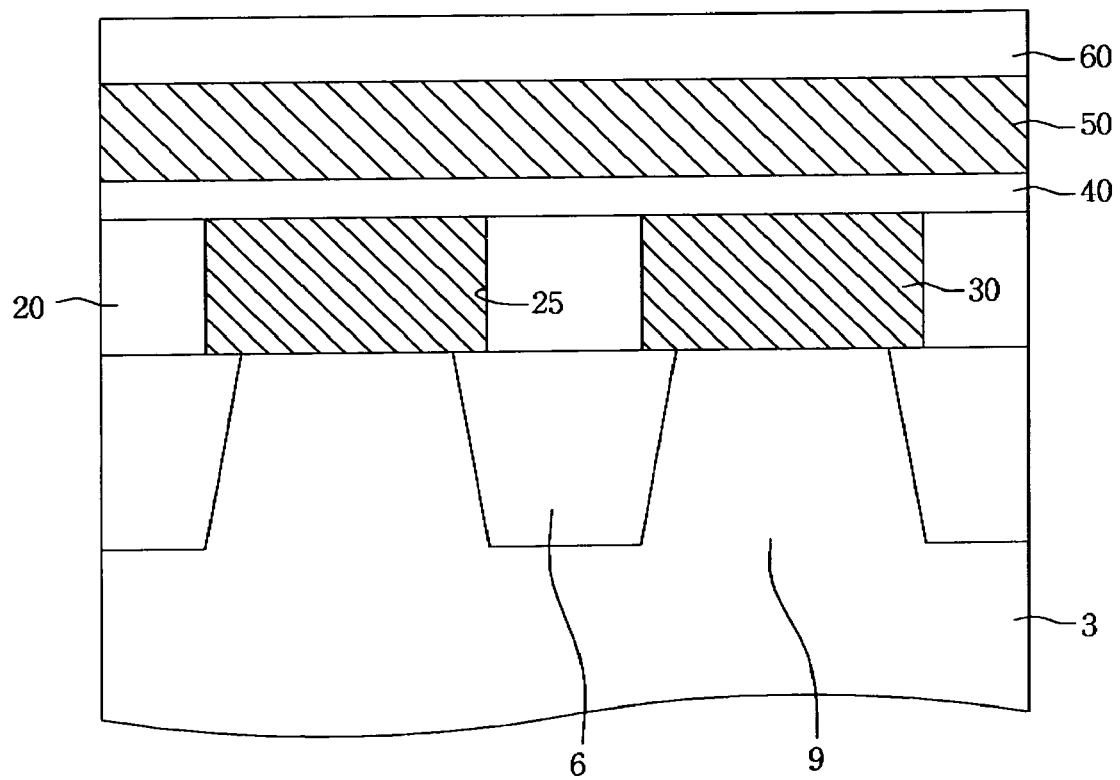

Referring to FIG. 3, according to example embodiments, a second insulating layer 40 may be formed on the first insulating layer 20 and the landing pads 30. The second insulating layer 40 may include insulating material having the same etch rate as or a different etch rate from the first insulating layer 20. The second insulating layer 40 may be formed of silicon and oxygen, e.g., $SiO_2$. A conductive layer 50 and a mask layer 60 may be sequentially formed on the second insulating layer 40. The conductive layer 50 may include doped polysilicon, metal material, metal nitride, or stacked materials thereof.

The conductive layer 50 may be in direct contact with at least one of the active regions 9 through contact holes (not shown) in the first and second insulating layers 20 and 40 or may not be in contact with the active regions 9. The mask layer 60 may include insulating material having the same etch rate as or a different etch rate from the second insulating layer 40. The mask layer 60 may include one of aluminum and silicon, and nitrogen, e.g., aluminum nitride (AlN), silicon nitride (SiN) or silicon oxynitride (SiON).

As a variation of example embodiments, when the first patterns 15, the first insulating layer 20 and the landing pads 30 are not formed on the non-active regions 6 and the active regions 9, the second insulating layer 40 may be formed to cover the non-active regions 6 and the active regions 9. The conductive layer 50 may be in direct contact with at least one of the active regions 9 through the contact holes in the second insulating layer 40 or may be not in contact with the active regions 9.

Figure 4:
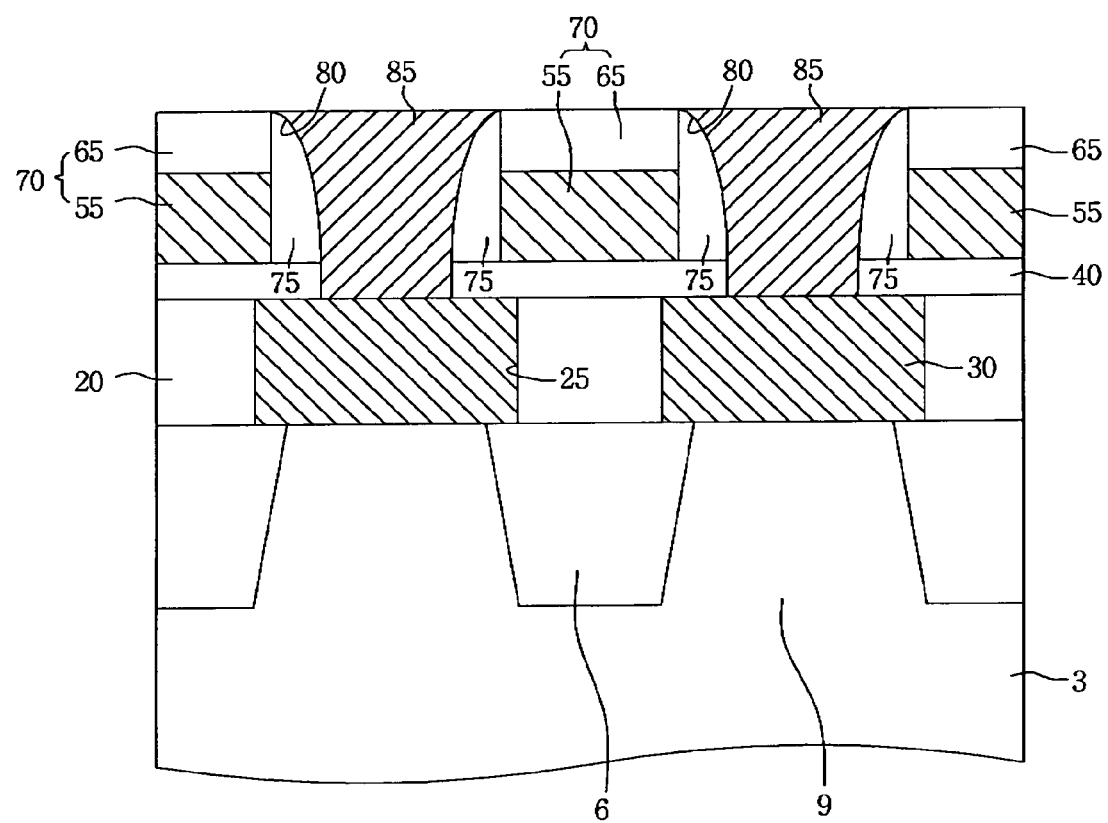

Referring to FIG. 4, photolithography and etch processes are performed on the conductive layer 50 and the mask layer 60 to form conductive patterns 55 and mask patterns 65 on the second insulating layer 40. The conductive patterns 55 and the mask patterns 65 may form second patterns 70. Spacers 75 may be formed on sidewalls of the second patterns 70. The spacers 75 may include insulating material having the same etch rate as or a different etch rate from the mask patterns 65.

The spacers 75 may include insulating material having the same etch rate as or a different etch rate from the second insulating layer 40. A third insulating layer (not shown) may be formed around the second patterns 70 to expose the second patterns 70. The third insulating layer may include insulating material having a different etch rate from the mask patterns 65. The third insulating layer may include insulating material having the same etch rate as or a different etch rate from the second insulating layer 40. The third insulating layer may be formed of silicon and oxygen, e.g., $SiO_2$.

Second connection holes 80 may be formed in predetermined or given regions between the second patterns 70. The second connection holes 80 may be formed to expose the landing pads 30. The second connection holes 80 may be surrounded by the second insulating layer 40, the third insulating layer and the second patterns 70. The second connection holes 80 may be surrounded by the second insulating layer 40 and the third insulating layer. Connection patterns 85 may be formed to fill the second connection holes 80. The connection patterns 85 may include doped polysilicon, metal material, metal nitride, or stacked materials thereof.

The connection patterns 85 may be in contact with the landing pads 30 through the second connection holes 80. The first insulating layer 20, the second insulating layer 40, the mask patterns 65, the spacers 75 and the third insulating layer (not shown) may constitute a lower insulating layer. As a variation of example embodiments, when the first patterns 15, the first insulating layer 20 and the landing pads 30 are not formed on the non-active regions 6 and the active regions 9, the connection patterns 85 may be in direct contact with the active regions 9 through the second connection holes 80.

Figure 5:
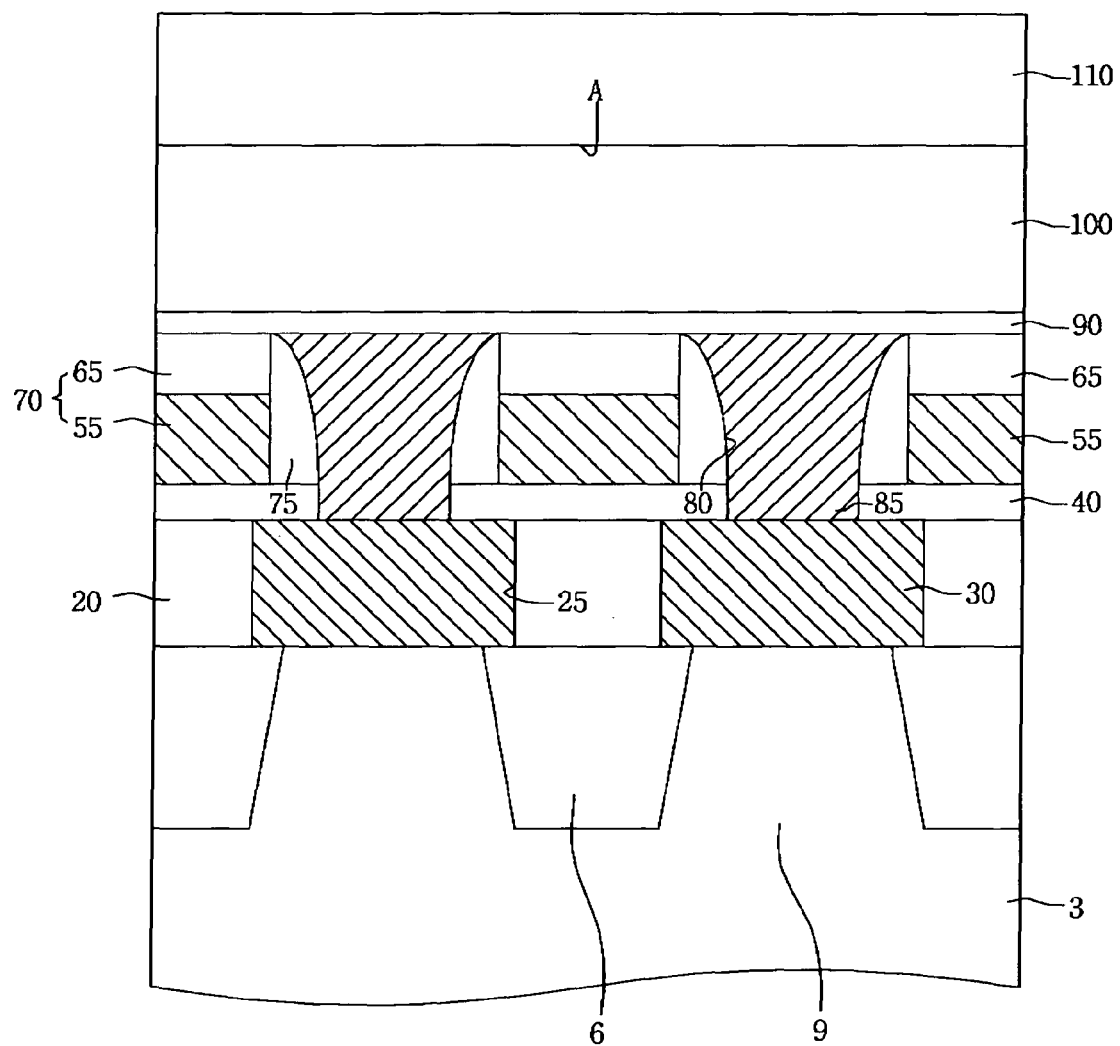

Referring to FIG. 5, according to example embodiments, fourth to sixth insulating layers 90, 100, and 110 may be sequentially formed on the second patterns 70, the spacers 75 and the connection patterns 85. The fourth insulating layer 90 may include insulating material having a different etch rate from the mask patterns 65 and the spacers 75. The fourth insulating layer 90 may include insulating material having a different etch rate from the third insulating layer. The fourth insulating layer 90 may be formed of one of aluminum and silicon, and nitrogen, e.g., AlN, SiN or SiON.

Therefore, when the mask patterns 65 are formed of SiN or SiON, the fourth insulating layer 90 may be formed of AlN. When the mask patterns 65 are formed of AlN, the fourth insulating layer 90 may be formed of SiN or SiON. The fourth insulating layer 90 may be used as an etch stopping layer when the fifth and sixth insulating layers 100 and 110 are etched.

The fifth insulating layer 100 may include insulating material having a different etch rate from the fourth insulating layer 90. The sixth insulating layer 110 may include insulating material having a different etch rate from the fifth insulating layer 100. The fifth and sixth insulating layers 100 and 110 may constitute an upper insulating layer. The fifth and sixth insulating layers 100 and 110 may have an external interface A along contacting surfaces with respect to each other.

Figure 6:
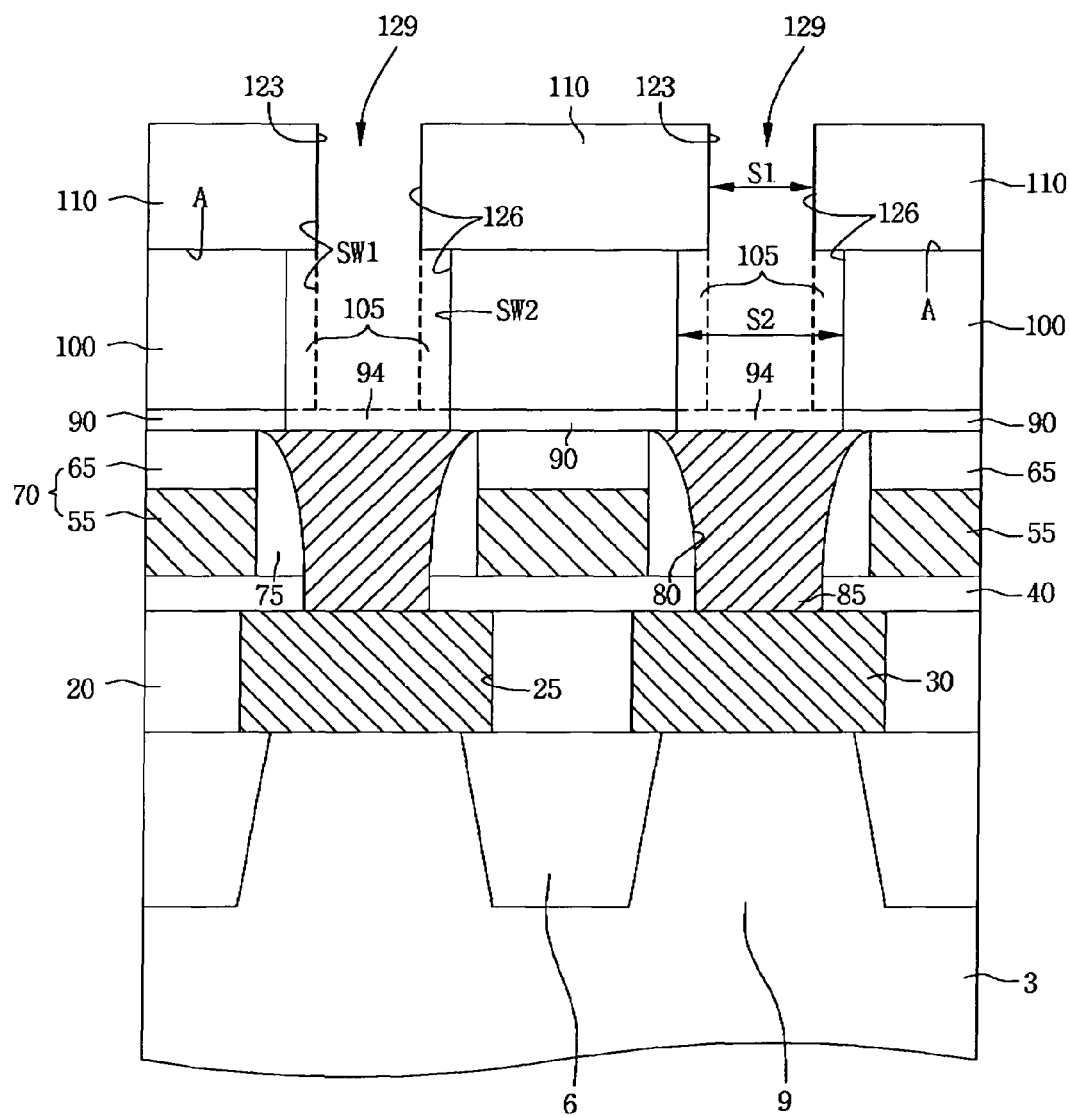

Referring to FIG. 6, according to example embodiments, a photoresist layer (not shown) may be formed on the sixth insulating layer 110. The photoresist layer may have openings aligning the connection patterns 85 and exposing the sixth insulating layer 110. The fifth and sixth insulating layers 100 and 110 may be etched through the openings using the photoresist layer as an etch mask.

In this case, the fifth and sixth insulating layers 100 and 110 may be etched using a first dry etchant including hexafluorobutyne ($C_4F_6$), oxygen ($O_2$), and at least one of octafluorocyclobutane ($C_4F_8$), octafluoropropane ($C_3F_8$), tetrafluoromethane ($CF_4$) and carbon monoxide (CO).

The first dry etchant may have an etch selectivity with respect to the fourth to sixth insulating layers 90 to 110. After the fifth and sixth insulating layers 100 and 110 are etched, the fifth and sixth insulating layers 100 and 110 may have first preliminary through holes 123 aligned with the openings of the photoresist layer. The first preliminary through holes 123 may have substantially the same first diameters S1 along a thickness direction perpendicular to top surfaces of the fifth and sixth insulating layers 100 and 110. In this case, each of the first preliminary through holes 123 may have substantially the same first sidewalls SW1 in the fifth and sixth insulating layers 100 and 110.

The first preliminary through holes 123 may be formed to expose the fourth insulating layer 90. After the first preliminary through holes 123 are formed in the fifth and sixth insulating layers 100 and 110, the photoresist layer may be removed from the sixth insulating layer 110. The fifth insulating layer 100 may be etched through the first preliminary through holes 123 using the fifth and sixth insulating layers 100 and 110 as an etch mask. The fifth insulating layer 100 may be etched using a first wet etchant including hydrofluoric acid (HF) or standard cleaning-1 (SC-1).

The first wet etchant may have an etch selectivity with respect to the fourth to sixth insulating layers 90 to 110. The SC-1 may be formed of ammonia water ($NH_4OH$), hydrogen peroxide ($H_2O_2$) and deionized water ($H_2O$). The SC-1 may be used at a lower temperature (a temperature ranging from 30 to 50° C.) or higher temperature (a temperature ranging from 50 to 80° C.). In such a case, the first wet etchant may remove a sacrificial region 105 from the first sidewall SW1 of the fifth insulating layer 100.

More specifically, the first preliminary through holes 123 may be formed as second preliminary through holes 126 Each of the second preliminary through holes 126 may have a second diameter S2 in the fifth insulating layer 100, and a first diameter S1 in the sixth insulating layer 110. The first diameter S1 may be smaller than the second diameter S2. Each of the second preliminary through holes 126 may have a second sidewall SW2 in the fifth insulating layer 100, and a first sidewall SW1 in the sixth insulating layer 110.

The second preliminary through holes 126 may be formed by etching the fifth insulating layer 100 using a second dry etchant. The second dry etchant may have an etch selectivity with respect to the fourth to sixth insulating layers 90 to 110. Then, the fourth insulating layer 90 may be etched through the second preliminary through holes 126 using the fifth and sixth insulating layers 100 and 110 as an etch mask. When SiN or SiON corresponds to the mask patterns 65, and AlN corresponds to the fourth insulating layer 90, the fourth insulating layer 90 may be etched using a second wet etchant including sulfuric acid ($H_2SO_4$) or SC-1.

The second wet etchant may have an etch selectivity with respect to the mask patterns 65, the spacers 75, the third insulating layer and the fourth to sixth insulating layers 90 to 110. $H_2SO_4$ may be applied to the fourth insulating layer 90 at a first step, and SC-1 may be applied to the fourth insulating layer 90 at a second step to be wet etched.

[Comparison of etch rate of AlN layer per wet etchant]

| TEST Sample | Measurement of Thickness before Test (Å) | Measurement of Thickness after Application of $H_2SO_4$ for 5 Minutes (Å) | Measurement of Thickness after Application of SC-1 for 5 Minutes (Å) |
|---|---|---|---|
| Aluminum Nitride (AlN) Layer | 900 900 | 0 0 | 0 0 |

The SC-1 may be used at a lower temperature (a temperature ranging from 30 to 50° C.). The fourth insulating layer 90 may be etched using a third dry etchant including chlorine ($Cl_2$), oxygen ($O_2$), hydrogen bromide (HBr) and hydrogen ($H_2$). The third dry etchant may have an etch selectivity with respect to the mask patterns 65, the spacers 75, the third insulating layer and the fourth to sixth insulating layers 90 to 110.

In contrast, when AlN corresponds to the mask patterns 65, and SiN or SiON corresponds to the fourth insulating layer 90, the fourth insulating layer 90 may be etched using a third wet etchant including phosphoric acid ($H_3PO_4$). The third wet etchant may have an etch selectivity with respect to the mask patterns 65, the spacers 75, the third insulating layer and the fourth to sixth insulating layers 90 to 110.

The fourth insulating layer 90 may be etched using a fourth dry etchant including tetrafluoromethane ($CF_4$), trifluoromethane ($CHF_3$), difluoromethane ($CH_2F_2$), fluoromethane ($CH_3F$) and Oxygen ($O_2$). The fourth dry etchant may have an etch selectivity with respect to the mask patterns 65, the spacers 75, the third insulating layer and the fourth to sixth insulating layers 90 to 110.

The second wet etchant, the third wet etchant, the third dry etchant or the fourth dry etchant may remove a sacrificial region 94 of the fourth insulating layer 90 below the second preliminary through holes 126. After the fourth insulating layer 90 is etched by the second wet etchant, the third wet etchant, the third dry etchant or the fourth dry etchant, the fourth insulating layer 90 may be formed to expose the connection patterns 85. As a result, the fourth to sixth insulating layers 90 to 110 may have through holes 129.

The through holes 129 may have substantially the same diameters S1 and S2 as the second preliminary through holes 126 in the fifth and sixth insulating layers 100 and 110. The through holes 129 may have the same second diameters S2 in the fourth and fifth insulating layers 90 and 100. Therefore, the through holes 129 may have different diameters S1 and S2 at a lower part and an upper part with respect to the external interface A between the fifth and sixth insulating layers 100 and 110. The through holes 129 may fully expose the connection patterns 85. As a result, the through holes 129 may be stably formed to be large through the fourth to sixth insulating layers 90 to 110.

The second wet etchant, the third wet etchant, the third dry etchant or the fourth dry etchant may remove the fourth insulating layer 90 to a desired extent without causing etch damage to the lower insulating layer. In addition, even when the first preliminary through holes 123 are misaligned with the connection patterns 85, the second wet etchant, the third wet etchant, the third dry etchant or the fourth dry etchant may remove the fourth insulating layer 90 without causing etch damage to the lower insulating layer.

Figure 7:
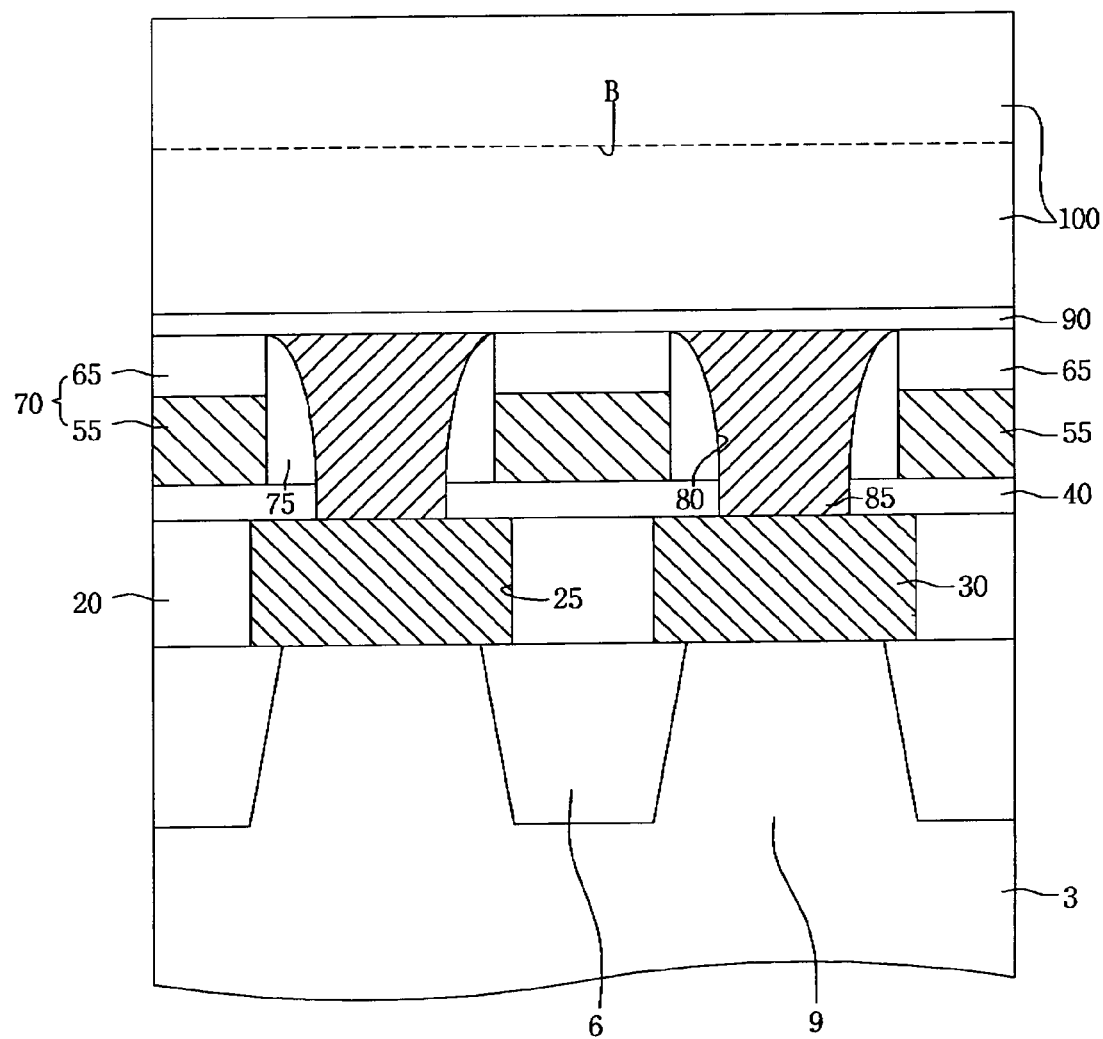
FIGS. 7 and 8 are cross-sectional views taken along line I-I' of FIG. 1, illustrating an intermediate step of a method of forming a semiconductor cell structure.
Figure 8:
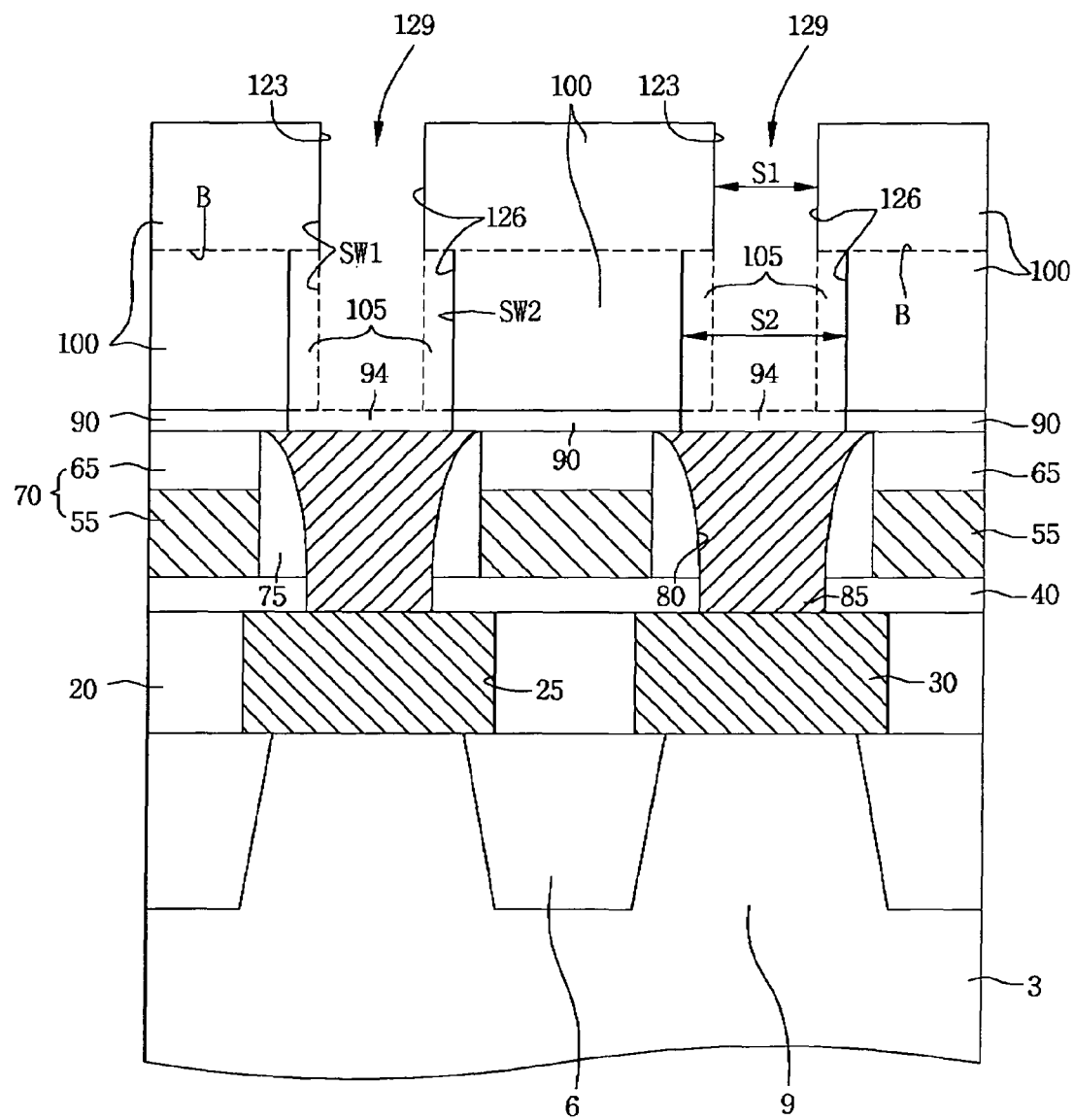

FIGS. 7 and 8 are cross-sectional views taken along line I-I' of FIG. 1, illustrating an intermediate step of a method of forming a semiconductor cell structure. In FIGS. 7 and 8, like reference numerals designate like elements in FIGS. 1 to 6.

Referring to FIG. 7, fourth and fifth insulating layers 90 and 100 may be sequentially formed on the second patterns 70, the third insulating layer, the spacers 75 and the connection patterns 85 of FIG. 4. The thickness of the fifth insulating layer 100 may be substantially the same as or different from that of the fifth insulating layers 100 and 110 of FIG. 5. The fifth insulating layer 100 may include insulating material having a concentration gradient of impurity ions along a thickness direction perpendicular to a top surface.

The concentration gradient of impurity ions may be obtained by performing an ion implantation process on the fifth insulating layer 100 or a deposition process of the fifth insulating layer 100 on the fourth insulating layer 90. The ion implantation process may be performed on the fifth insulating layer 100 by adjusting implantation energy of impurity ions. The deposition process may be performed by differentiating concentration of the impurity ions along a deposition time while depositing the fifth insulating layer 100 on the fourth insulating layer 90. The fifth insulating layer 100 may have an internal interface B connecting inflection points of the concentration gradient of the impurity ions in a parallel manner with respect to a top surface thereof.

Referring to FIG. 8, according to example embodiments, the processes of FIG. 6 may be applied to the fourth and fifth insulating layers 90 and 100 in the same manner. For this purpose, the first dry etchant of FIG. 6 may be applied to the fifth insulating layer 100. The first dry etchant may have an etch selectivity with respect to the fourth and fifth insulating layers 90 and 100. The first dry etchant may form first preliminary through holes 123 in the fifth insulating layer 100 through the openings of the photoresist layer of FIG. 6. The first preliminary through holes 123 may have substantially the same diameters S1 as those of the first preliminary through holes 123 of FIG. 6.

Then, the first wet etchant or the second dry etchant of FIG. 6 may be applied to the fifth insulating layer 100. The first wet etchant or the second dry etchant may remove a sacrificial region 105 of the fifth insulating layer 100 through the first preliminary through holes 123. The fifth insulating layer 100 may have second preliminary through holes 126 through the first wet etchant or the second dry etchant. The second preliminary through holes 126 may have substantially the same diameters S1 and S2 as the second preliminary through holes 126 of FIG. 6.

Afterwards, the second wet etchant, the third wet etchant, the third dry etchant or the fourth dry etchant may be applied to the fourth insulating layer 90. The second wet etchant, the third wet etchant, the third dry etchant or the fourth dry etchant may remove a sacrificial region 94 of the fourth insulating layer 90 through the second preliminary through holes 126. The fourth insulating layer 90 may be etched using the second wet etchant, the third wet etchant, the third dry etchant or the fourth dry etchant to expose the connection patterns 85. As a result, the fourth and fifth insulating layers 90 and 100 may have through holes 129.

The through holes 129 may have substantially the same diameters S1 and S2 as the through holes 129 of FIG. 6. In this case, the through holes 129 may have different diameters S1 and S2 at a lower part and an upper part with respect to an internal interface B of the fifth insulating layer 100. The through holes 129 may fully expose the connection patterns 85.

Figure 9:
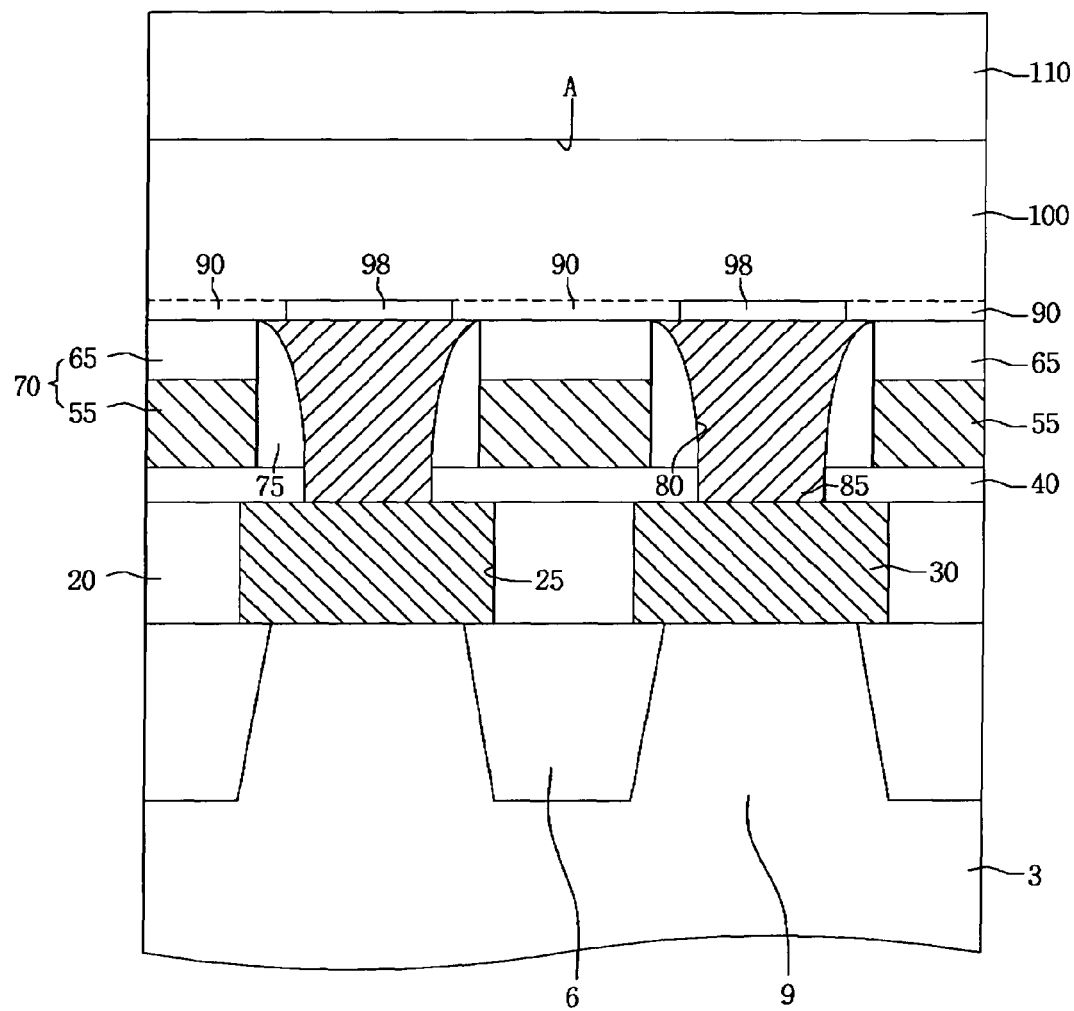
FIGS. 9 and 10 are cross-sectional views taken along line I-I' of FIG. 1, illustrating an intermediate step of a method of forming a semiconductor cell structure.
Figure 10:
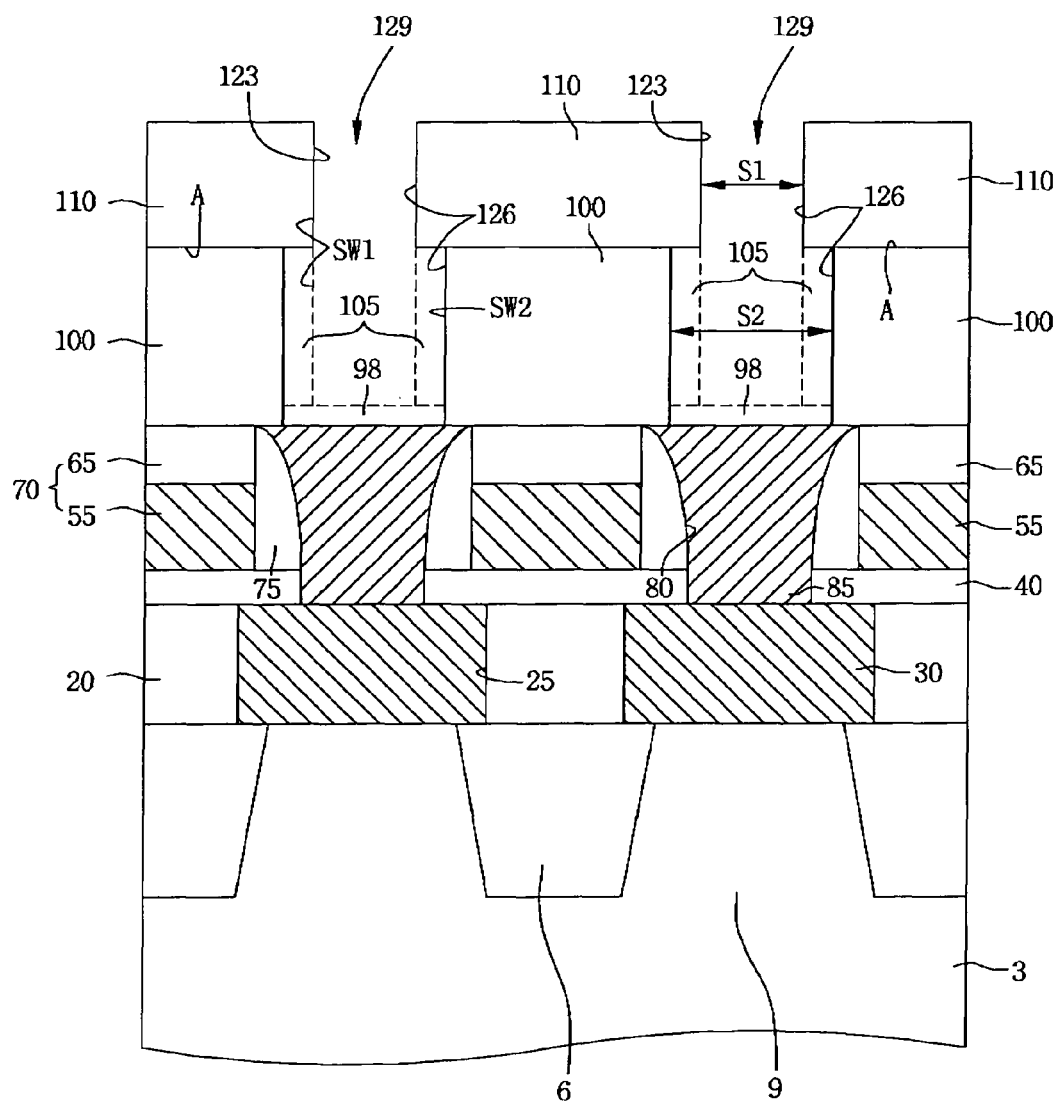

FIGS. 9 and 10 are cross-sectional views taken along line I-I' of FIG. 1, illustrating an intermediate step of a method of forming a semiconductor cell structure. In FIGS. 9 and 10, like reference numerals designate like elements in FIGS. 1 to 6.

Referring to FIG. 9, a fourth insulating layer 90 may be formed on the second patterns 70, the third insulating layer, the spacers 75 and the connection patterns 85 of FIG. 4. Photoresist patterns (not shown) may be formed on the fourth insulating layer 90. The photoresist patterns may be formed to be aligned with the connection patterns 85. An area of each of the photoresist patterns may be the same size as or a different size from that of each of the connection patterns 85. The fourth insulating layer 90 may be etched using the photoresist patterns as an etch mask.

In this case, the fourth insulating layer 90 may be etched using the third dry etchant or the fourth dry etchant of FIG. 6. The third dry etchant or the fourth dry etchant may etch the fourth insulating layer 90, so that sacrificial patterns 98 are formed on the connection patterns 85. When the photoresist patterns are replaced by hard patterns, the second wet etchant or the third wet etchant of FIG. 6 may be applied to the fourth insulating layer 90. The sacrificial patterns 98 may be formed to expose the second patterns 70, the spacers 75 and the third insulating layer.

The sacrificial patterns 98 may be formed to expose the second patterns 70, the spacers 75, the third insulating layer, and the connection patterns 85. Afterwards, the photoresist patterns may be removed from the sacrificial patterns 98. The fifth and sixth insulating layers 100 and 110 may be sequentially formed on the second patterns 70, the spacers 75, the third insulating layer, and the connection patterns 85 to cover the sacrificial patterns 98. The fifth and sixth insulating layers 100 and 110 may have an external interface A along contacting surfaces with respect to each other.

Referring to FIG. 10, according to example embodiments, the processes of FIG. 6 may be applied to the fifth and sixth insulating layers 100 and 110 in the same manner. For this purpose, the first dry etchant of FIG. 6 may be applied to the fifth and sixth insulating layers 100 and 110. The first dry etchant may form first preliminary through holes 123 in the fifth and sixth insulating layers 100 and 110 through the openings of the photoresist layer of FIG. 6. The first preliminary through holes 123 may have substantially the same diameters S1 as the first preliminary through holes 123 of FIG. 6.

The first wet etchant or the second dry etchant of FIG. 6 may be applied to the fifth insulating layer 100. The first wet etchant or the second dry etchant may remove the sacrificial region 105 of the fifth insulating layer 100 through the first preliminary through holes 123. The fifth and sixth insulating layers 100 and 110 may have second preliminary through holes 126 through the first wet etchant or the second dry etchant. The second preliminary through hole 126 may expose the sacrificial patterns 98. The second preliminary through holes 126 may have substantially the same diameters S1 and S2 as the second preliminary through holes 126 of FIG. 6.

Subsequently, a second wet etchant, a third wet etchant, a third dry etchant or a fourth dry etchant may be applied to the sacrificial patterns 98. The second wet etchant, the third wet etchant, the third dry etchant or the fourth dry etchant may fully remove the sacrificial patterns 98 from the semiconductor substrate 3 through the second preliminary through holes 126. In this case, the connection patterns 85 may be exposed to the fifth and sixth insulating layers 100 and 110. As a result, the fifth and sixth insulating layers 100 and 110 may have through holes 129.

Alternatively, the second wet etchant, the third wet etchant, the third dry etchant or the fourth dry etchant may partially remove the sacrificial patterns 98 from the semiconductor substrate 3. In such a case, the sacrificial patterns 98 may partially remain below the fifth insulating layer 100. The sacrificial patterns 98 may be etched by the second wet etchant, the third wet etchant, the third dry etchant or the fourth dry etchant to expose the connection patterns 85. As a result, the sacrificial patterns 98 and the fifth and sixth insulating layers 100 and 110 may have through holes 129.

The through holes 129 may have substantially the same diameters S1 and S2 as the through holes 129 of FIG. 6. The through holes 129 may have different diameters S1 and S2 at an upper part and a lower part with respect to the external interface A of the fifth and sixth insulating layers 100 and 110. The through holes 129 may fully expose the connection patterns 85. As a result, the through holes 129 may be stably formed to be large through the fifth and sixth insulating layers 100 and 110.

The second wet etchant, the third wet etchant, the third dry etchant or the fourth dry etchant may sufficiently remove the sacrificial patterns 98 without causing etch damage to the lower insulating layer. In addition, even when the first preliminary through holes 123 are misaligned with the connection patterns 85, the second wet etchant, the third wet etchant, the third dry etchant or the fourth dry etchant may remove the sacrificial patterns 98 without causing etch damage to the lower insulating layer.

Figure 11:
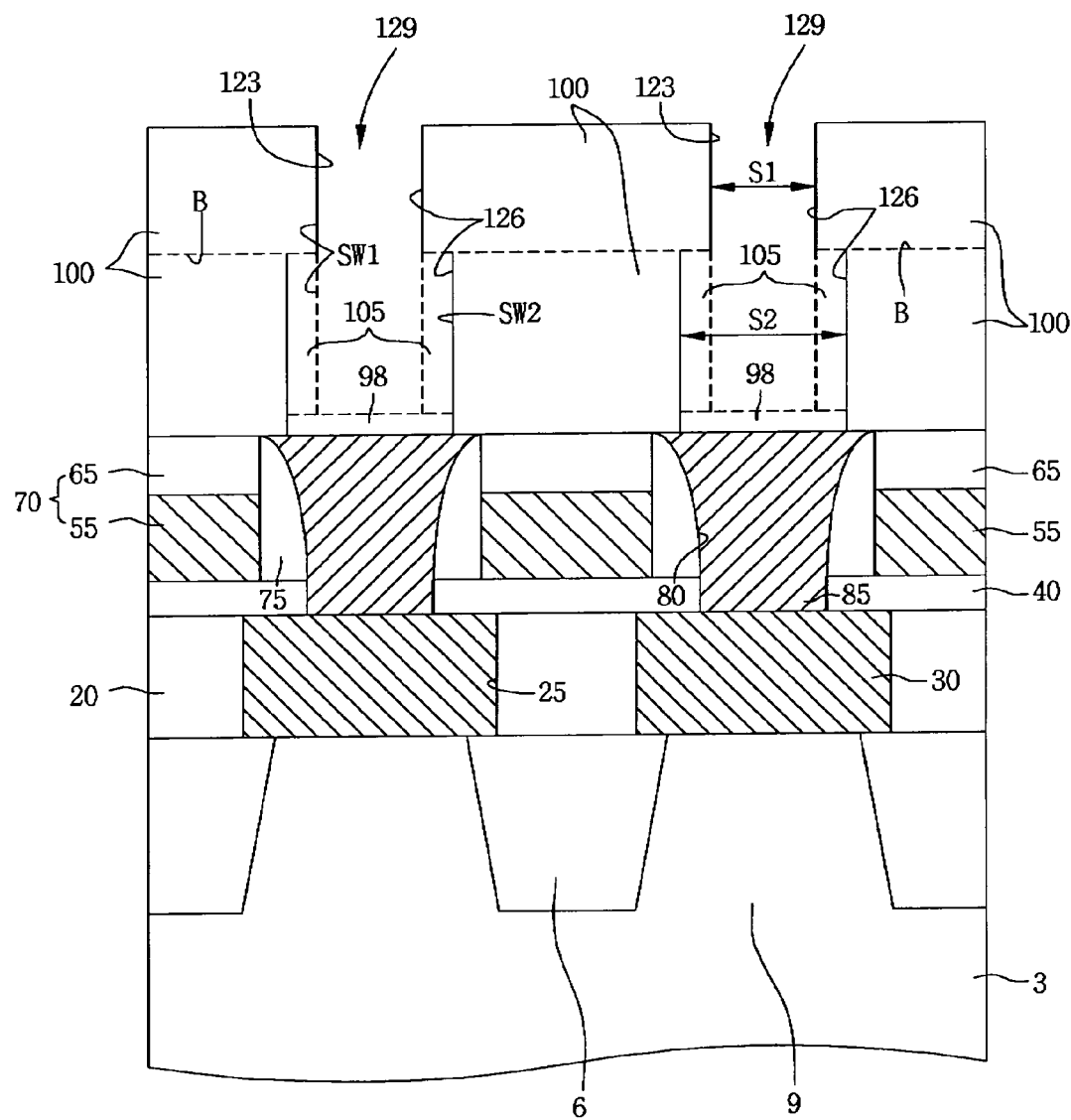
FIG. 11 is a cross-sectional view taken along line I-I' of FIG. 1, illustrating an intermediate step of a method of forming a semiconductor cell structure.

FIG. 11 is a cross-sectional view taken along line I-I' of FIG. 1, illustrating an intermediate step of a method of forming a semiconductor cell structure. In FIG. 11, like reference numerals designate like elements in FIGS. 1 to 6.

Referring to FIG. 11, the fourth insulating layer 90 of FIG. 9 may be formed on the second patterns 70, the third insulating layer, the spacers 75 and the connection patterns 85 of FIG. 4. Photoresist patterns (not shown) may be formed on the fourth insulating layer 90. The photoresist patterns may be formed to be aligned with the connection patterns 85. Area of each of the photoresist patterns may be the same size as or different sizes from that of each of the connection patterns 85. The fourth insulating layer 90 may be etched using the photoresist patterns as an etch mask.

In this case, the fourth insulating layer 90 may be etched through the third dry etchant or the fourth dry etchant of FIG. 6. The third dry etchant or the fourth dry etchant may etch the fourth insulating layer 90, so that sacrificial patterns 98 are formed on the connection patterns 85. The sacrificial patterns 98 may be formed to expose the second patterns 70, the spacers 75 and the third insulating layer. The sacrificial patterns 98 may be formed to expose the second patterns 70, the spacers 75, the third insulating layer, and the connection patterns 85.

The photoresist patterns may be removed from the sacrificial patterns 98. The fifth insulating layer 100 of FIG. 7 may be formed on the second patterns 70, the spacers 75, the third insulating layer, and the connection patterns 85 to cover the sacrificial patterns 98. The fifth insulating layer 100 may have an internal interface B connecting inflection points of the concentration gradient of impurity ions in a parallel manner with respect to a top surface thereof. The processes of FIG. 6 may be applied to the sacrificial patterns 98 and the fifth insulating layer 100 in the same manner.

For this purpose, the first dry etchant of FIG. 6 may be applied to the fifth insulating layer 100. The first dry etchant may form first preliminary through holes 123 in the fifth insulating layer 100 through the openings of the photoresist layer of FIG. 6. The first dry etchant may have an etch selectivity with respect to the sacrificial patterns 98 and the fifth insulating layer 100. The first preliminary through holes 123 may have substantially the same diameters S1 as those of the first preliminary through holes 123 of FIG. 6. Afterwards, the first wet etchant or the second dry etchant of FIG. 6 may be applied to the fifth insulating layer 100.

The first wet etchant or the second dry etchant may remove the sacrificial region 105 of the fifth insulating layer 100 through the first preliminary through holes 123. The fifth insulating layer 100 may have second preliminary through holes 126 using the first wet etchant or the second dry etchant. The second preliminary through holes 126 may have substantially the same diameters S1 and S2 as the second preliminary through holes 126 of FIG. 6. Subsequently, the second wet etchant, the third wet etchant, the third dry etchant or the fourth dry etchant may be applied to the sacrificial patterns 98.

The second wet etchant, the third wet etchant, the third dry etchant or the fourth dry etchant may fully remove the sacrificial patterns 98 from the semiconductor substrate 3 through the second preliminary through holes 126. In this case, the connection patterns 85 may be exposed to the fifth insulating layer 100. As a result, the fifth insulating layer 100 may have through holes 129. In contrast, the second wet etchant, the third wet etchant, the third dry etchant or the fourth dry etchant may partially remove the sacrificial patterns 98 from the semiconductor substrate 3.

In such a case, the sacrificial patterns 98 may partially remain below the fifth insulating layer 100. The sacrificial patterns 98 may expose the connection patterns 85 using the second wet etchant, the third wet etchant, the third dry etchant or the fourth dry etchant. As a result, the sacrificial patterns 98 and the fifth insulating layer 100 may have through holes 129. The through holes 129 may have substantially the same diameters S1 and S2 as the through holes 129 of FIG. 6.

In this case, the through holes 129 may have different diameters S1 and S2 at an upper part and a lower part with respect to an internal interface B of the fifth insulating layer 100. The through holes 129 may fully expose the connection patterns 85.

Figure 12:
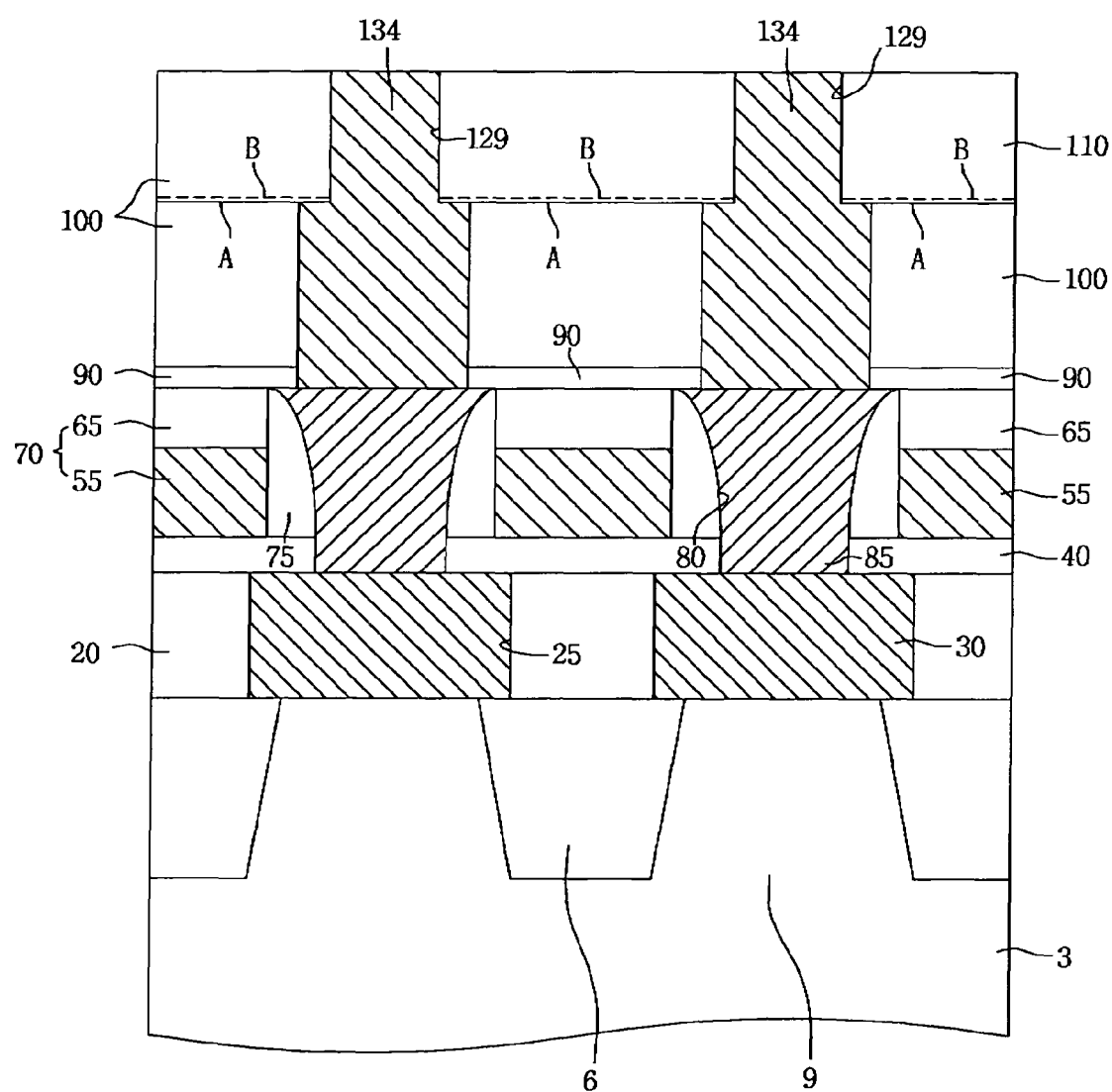
FIGS. 12 and 13 are cross-sectional views taken along line I-I' of FIG. 1, illustrating a final step of a method of forming a semiconductor cell structure.

FIG. 12 is a cross-sectional view taken along line I-I' of FIG. 1, illustrating a final step of a method of forming a semiconductor cell structure. Referring to FIG. 12, according to example embodiments, plugs 134 may be formed in the through holes 129 of FIGS. 6, 8, 10 and 11. In the through holes 129 of FIGS. 6 and 8, the plugs 134 may be partially surrounded by the fourth insulating layer 90. In the through holes 129 of FIGS. 6 and 8, the plugs 134 may not be surrounded by the fourth insulating layer 90. The plugs 134 may be formed to expose a top surface of the fifth or sixth insulating layer 100 or 110 and to fill the through holes 129.

The plugs 134 may be molded in the fourth and fifth insulating layers 90 and 100 or fourth to sixth insulating layers 90 to 110 depending on the shape of the through holes 129. The plugs 134 may include doped polysilicon, metal material, metal nitride or stacked materials thereof. The plugs 134 may have a desired contact resistance with respect to the connection patterns 85 through the through holes 129 compared with the conventional art.

The plugs 134 may have a smaller internal resistance through the through holes 129 compared with a conventional art. The plugs 134 may be electrically insulated from the conductive patterns 55 through the lower insulating layer compared with the conventional art. As a result, the plugs 134 together with the first patterns 15, the landing pads 25, the second patterns 70 and the connection patterns 85 may constitute the semiconductor cell structure 140 according to example embodiments. As a variation of the example embodiments, the semiconductor cell structure 140 may not have the first patterns 15, the first insulating layer 20 and the landing pads 25.

Figure 13:
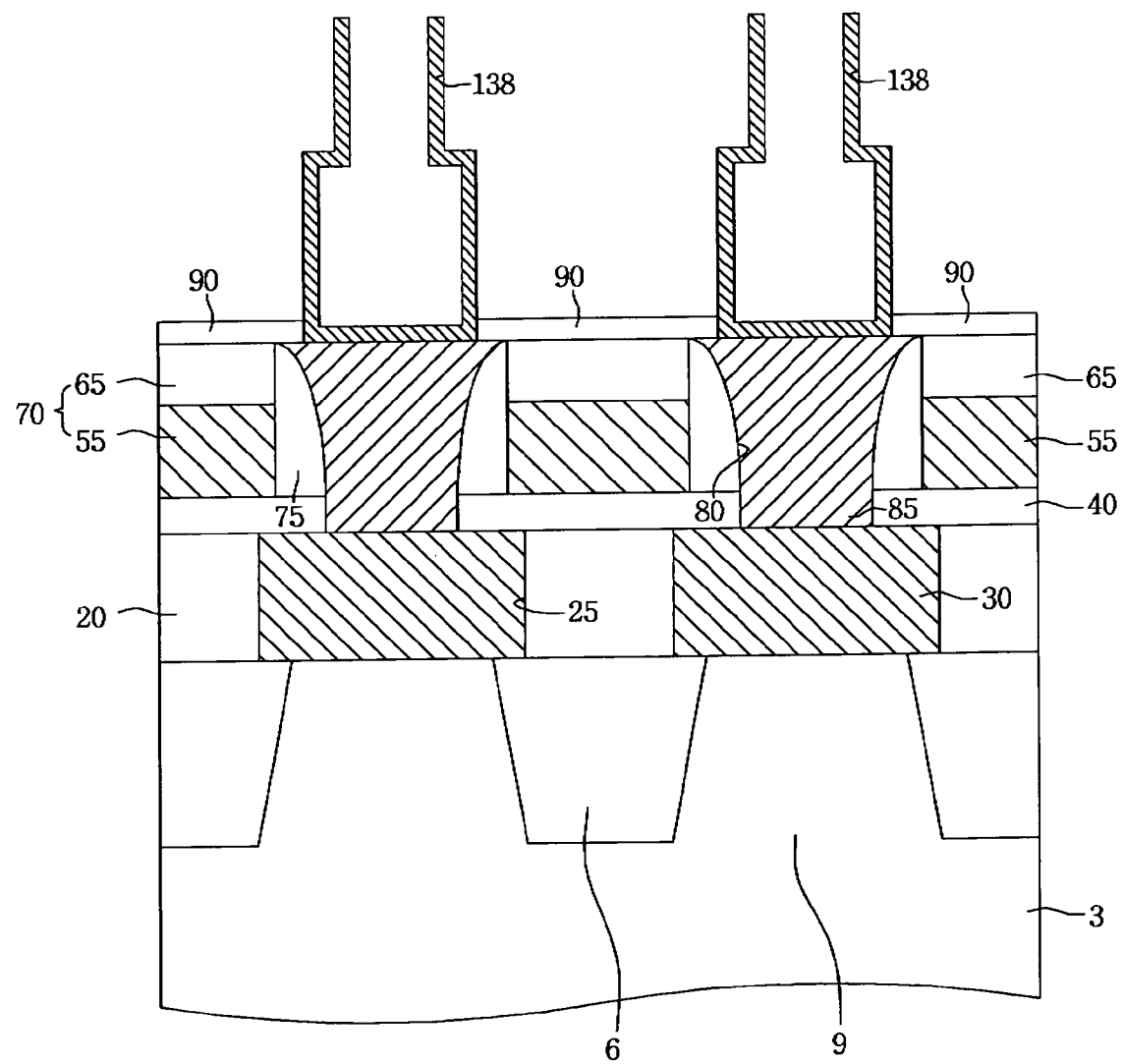

FIG. 13 is a cross-sectional view taken along line I-I' of FIG. 1, illustrating a final step of a method of forming a semiconductor cell structure. Referring to FIG. 13, according to example embodiments, an electrical node layer and a sacrificial layer (not shown) may be sequentially formed in the through holes 129 of FIG. 6, 8, 10 or 11. In the through holes 129 of FIGS. 6 and 8, the electrical node layer may be partially surrounded by the fourth insulating layer 90. The electrical node layer may be formed on the sixth insulating layer 110 to conformally cover the through holes 129 of the fourth to sixth insulating layers 90 to 110 of FIG. 6.

The electrical node layer may be formed on the fifth insulating layer 100 to conformally cover the through holes 129 of the fourth and fifth insulating layers 90 and 100 of FIG. 8. In the through holes 129 of FIGS. 10 and 11, the electrical node layer may not be surrounded by the fourth insulating layer 90. The electrical node layer may be formed on the sixth insulating layer 110 to conformally cover the through holes 129 of the fifth and sixth insulating layers 100 and 110 of FIG. 10. The electrical node layer may be formed on the fifth insulating layer 100 to conformally cover the through holes 129 of the fifth insulating layer 100 of FIG. 11. The electrical node layer may include doped polysilicon, metal material, metal nitride or stacked materials thereof.

The sacrificial layer may be formed on the electrical layer to fill the through holes 129. The electrical node layer and the sacrificial layer may be etched to expose a top surface of the fifth insulating layer 100 or the sixth insulating layer 110 to form electrical nodes 138 and sacrificially molded patterns. Subsequently, the fifth and sixth insulating layers 100 and 110 of FIG. 6, and the sacrificially molded patterns may be removed from the electrical nodes 138. Lower parts of the electrical nodes 138 may be surrounded by the fourth insulating layer 90 of FIG. 6.

The fifth insulating layer 100 of FIG. 8 and the sacrificially molded patterns may be removed from the electrical nodes 138. The lower parts of the electrical nodes 138 may be surrounded by the fourth insulating layer 90 of FIG. 8. The fifth and sixth insulating layers 100 and 110 of FIG. 10, and sacrificially molded patterns may be removed from the electrical nodes 138. Sidewalls of the electrical nodes 138 may be exposed on the connection patterns 85 as a whole. The fifth insulating layer 100 of FIG. 11 and the sacrificially molded patterns may be removed from the electrical nodes 138. The sidewalls of the electrical nodes 138 may be exposed on the connection patterns 85 as a whole.

The electrical nodes 138 may include a lower electrode of a capacitor. The electrical nodes 138 may have a desired contact resistance with respect to the connection patterns 85 through the through holes 129 compared with the conventional art. The electrical nodes 138 may have a smaller internal resistance through the through holes 129 compared with a conventional art. The electrical nodes 138 may be electrically insulated from the conductive patterns 55 through the lower insulating layer compared with the conventional art.

The electrical nodes 138 together with the first patterns 15, the landing pads 25, the second patterns 70 and the connection patterns 85 may constitute the semiconductor cell structure 140 according to example embodiments. As a variation of the example embodiments, the semiconductor cell structure 140 may not have the first patterns 15, the first insulating layer 20 and the landing pads 25.

Figure 14:
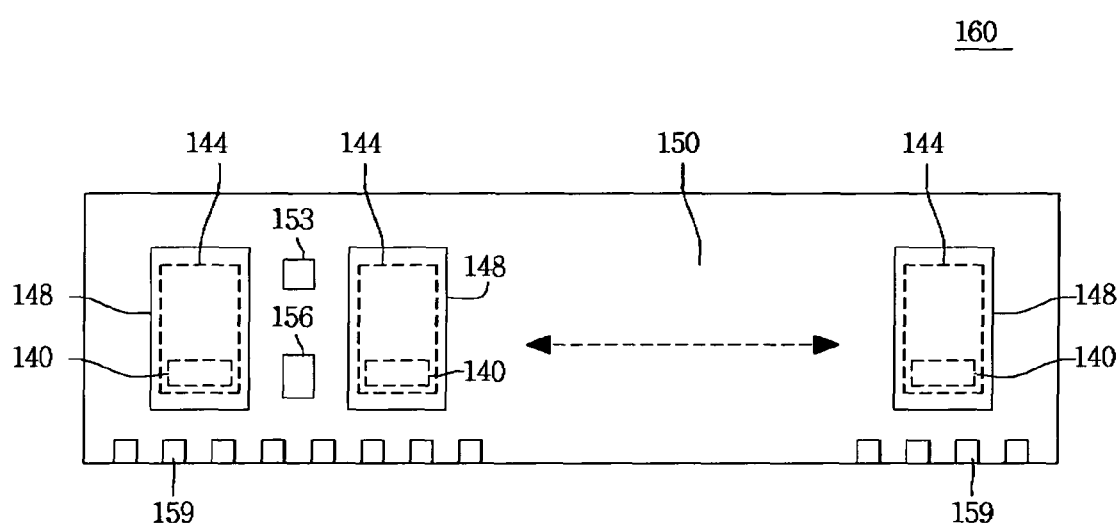
FIG. 14 is a plan view illustrating a method of forming a semiconductor module according to an example embodiment.

A method of forming a semiconductor module and a method of forming a processor-based system according to example embodiments will be described below. FIG. 14 is a plan view illustrating a method of forming a semiconductor module 160 according to example embodiments.

Referring to FIG. 14, according to example embodiments, a module substrate 150 may be prepared. The module substrate 150 may include a printed circuit board. The module substrate 150 may include internal circuits (not shown), electric pads (not shown) and connectors 159. The internal circuits may be electrically connected to the electric pads and the connectors 159. Semiconductor package structures 148 and at least one resistor 153 may be formed on the module substrate 150.

The semiconductor package structures 148, at least one resistor 153 and at least one condenser 156 may be formed on the module substrate 150. The semiconductor package structures 148, at least one resistor 153 and at least one condenser 156 may be electrically connected to the electric pads. Each of the semiconductor package structures 148 may include at least one semiconductor device 144. The semiconductor device 144 may have a cell array region and a peripheral circuit region.

The cell array region may have the active regions 9 of FIG. 1 repeatedly and periodically along columns and rows of the semiconductor substrate 3 of FIG. 2. Therefore, the first pattern 15, the landing pad 30, the second connection hole 80 and the through hole 129 together with the active region 9 may be arranged in the cell array region repeatedly and periodically. As a result, the cell array region may have the plurality of semiconductor cell structures of FIG. 12 or 13. The peripheral circuit region may surround the cell array region.

The peripheral circuit region may have peripheral circuits to be electrically connected to the cell array region. The peripheral circuits may have semiconductor peripheral structures having a different shape from the semiconductor cell structure 140 of FIG. 12 or 13. A part of the peripheral circuits may have the semiconductor cell structure 140 of FIG. 12. Meanwhile, the semiconductor package structures 148 and at least one resistor 153 may constitute a semiconductor module 160 together with the module substrate 150.

The semiconductor package structures 148, at least one resistor 153 and at least one condenser 156 may constitute the semiconductor module 160 together with the module substrate 150. The semiconductor module 160 may have improved electrical characteristics compared with the conventional art. The semiconductor module 160 may be electrically connected to the processor-based system 190 of FIG. 15 through the connectors 159 of the module substrate 150.

Figure 15:
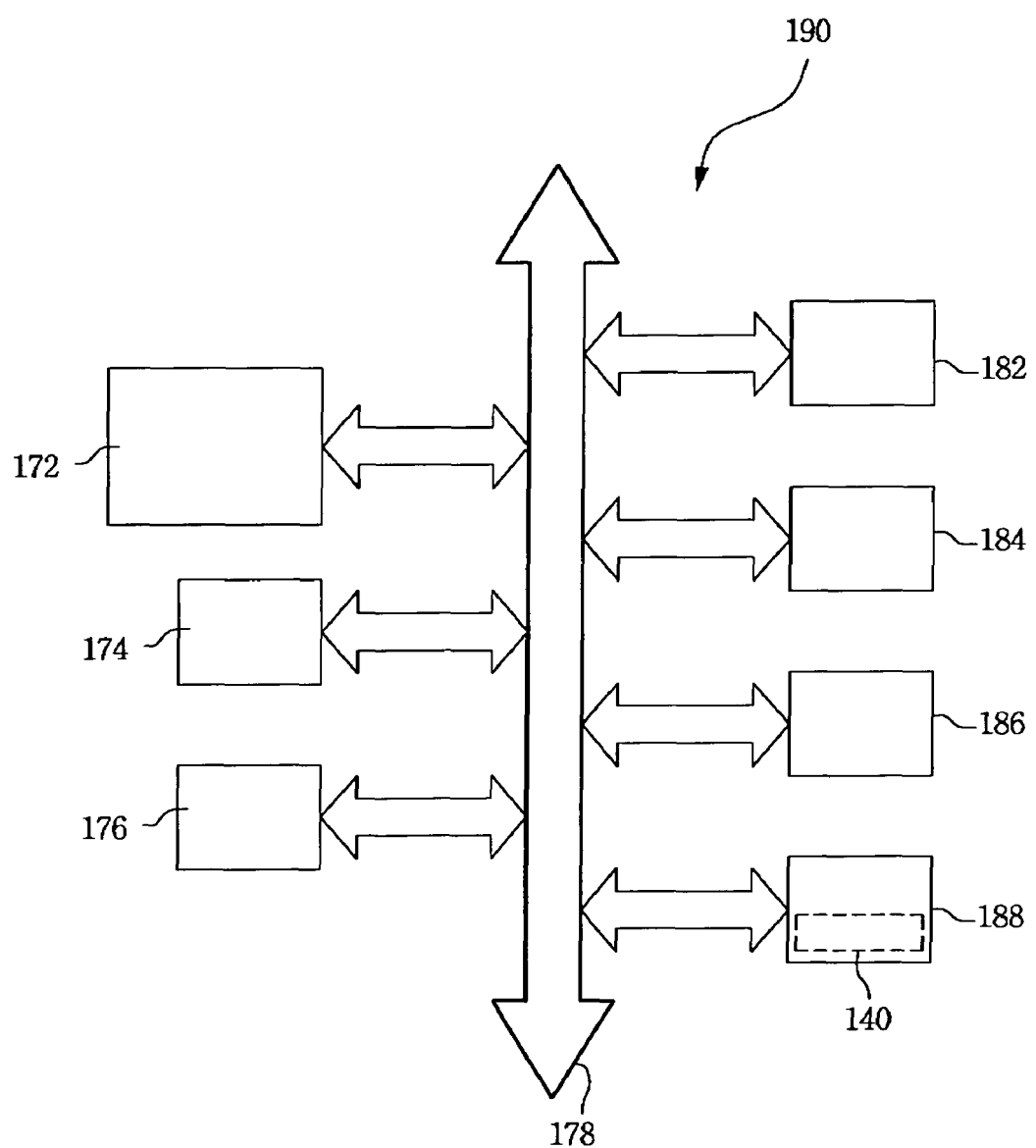
FIG. 15 is a plan view illustrating a method of forming a processor-based system according to an example embodiment.

FIG. 15 is a plan view illustrating a method of forming a processor-based system according to example embodiments. Referring to FIG. 15, according to example embodiments, at least one system board (not shown) may be prepared. The at least one system board may have at least one bus line 178. A first module unit may be formed on the at least one bus line 178. The first module unit may be electrically connected to at least one bus line 178. The first module unit may include a central processing unit (CPU) 172, a floppy disk drive 174 and a compact disk ROM drive 176.

Further, a second module device may be formed on the at least one bus line 178. The second module device may be electrically connected to at least one bus line 178. The second module device may include a first I/O device 182, a second I/O device 184, a read-only memory (ROM) 186 and a random access memory (RAM) 188.

The RAM 188 may include the semiconductor cell structure 140 of FIG. 13 or 14. The ROM 186 may include the semiconductor cell structure 140 of FIG. 13. The first and second module units may constitute the processor-based system 190 according to example embodiments. The processor-based system 190 may have improved electrical characteristics compared with the conventional art. The processor-based system 190 may include a computer system, a process control system or other systems.

As described above, in example embodiments, a method of forming a semiconductor cell structure capable of stably forming a larger through hole in an upper insulating layer without exposing a conductive pattern in a lower insulating layer can be provided. For this purpose, the semiconductor cell structure can have different insulating materials with respect to an etching rate in insulating layers surrounding a lower portion of the through hole, and disposed below the through hole.

Also, example embodiments provide a method of forming a semiconductor device and a method of forming a semiconductor module, which are performed to be capable of improving electrical characteristics by using a semiconductor cell structure. For this purpose, the upper insulating layer can be etched using dry etchants or wet etchants having an etch selectivity with respect to the lower and upper insulating layers to have a through hole in the upper insulating layer without causing etch damage to the lower insulating layer, so that leakage current flows through the through hole can be minimized or reduced. The semiconductor device may include a volatile or non-volatile memory device.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A method of forming a semiconductor cell structure, comprising:
   forming first and second patterns over a semiconductor substrate, the forming each of the first and second patterns including sequentially stacking a conductive pattern and a mask pattern;
   forming a first insulating layer surrounding the first and second patterns;
   forming a connection pattern in the first insulating layer in a region between the first and second patterns;
   sequentially forming second and third insulating layers on the connection pattern; and
   etching the third insulating layer at least twice and the second insulating layer at least once to form a through hole, the through hole being surrounded by at least one of the second and third insulating layers, and a diameter of the through hole in a lower portion of the third insulating layer being greater than a diameter of the through hole in an upper portion of the third insulating layer.

2. The method of claim 1, wherein:
   the mask pattern includes silicon and nitrogen,
   the first insulating layer includes silicon and oxygen,
   the second insulating layer includes aluminum and nitrogen and is formed to cover the first and second patterns, the connection pattern and the first insulating layer,
   the third insulating layer includes an insulating material having a concentration gradient of impurity ions along a thickness direction perpendicular to a top surface thereof, and
   the conductive pattern and the connection pattern include conductive material.

3. The method of claim 2, wherein the etching the third insulating layer at least twice and the second insulating layer at least once to form a through hole step includes:
   forming a photoresist layer on the third insulating layer, the photoresist layer having an opening aligning the connection pattern and exposing the third insulating layer;
   etching the third insulating layer through the opening using the photoresist layer as an etch mask to form a first preliminary through hole in the third insulating layer, the first preliminary through hole having substantially a same diameter along a thickness direction perpendicular to the top surface of the third insulating layer, and the first preliminary through hole exposing the second insulating layer;
   removing the photoresist layer from the semiconductor substrate;
   etching a lower portion of the third insulating layer through the first preliminary through hole using the third insulating layer as an etch mask to form a second preliminary through hole, the second preliminary through hole having a diameter D2 in the lower portion of the third insulating layer and a diameter D1 in an upper portion of the third insulating layer, wherein D2>D1; and
   etching the second insulating layer through the second preliminary through hole using the third insulating layer as an etch mask to form the through hole exposing the connection pattern.

4. The method of claim 1, wherein:
   the mask pattern includes silicon and nitrogen,
   the first insulating layer includes silicon and oxygen,
   the second insulating layer includes aluminum and nitrogen and is formed to cover the connection pattern,
   the third insulating layer includes an insulating material having a concentration gradient of impurity ions along a thickness direction perpendicular to a top surface thereof, and
   the conductive pattern and the connection pattern include conductive material.

5. The method of claim 4, wherein the etching the third insulating layer at least twice and the second insulating layer at least once to form a through hole step includes:
   forming a photoresist layer on the third insulating layer, the photoresist layer having an opening aligning the connection pattern and exposing the third insulating layer;
   etching the third insulating layer through the opening using the photoresist layer as an etch mask to form a first preliminary through hole in the third insulating layer, the first preliminary through hole having substantially a same diameter along a thickness direction perpendicular to the top surface of the third insulating layer, and the first preliminary through hole exposing the second insulating layer;
   removing the photoresist layer from the semiconductor substrate;
   etching a lower portion of the third insulating layer through the first preliminary through hole using the third insulating layer as an etch mask to form a second preliminary through hole, the second preliminary through hole having a diameter D2 in the lower portion of the third insulating layer, and a diameter D1 in an upper portion of the third insulating layer, wherein D2>D1; and
   etching the second insulating layer through the second preliminary through hole using the third insulating layer as an etch mask to form the through hole exposing the connection pattern.

6. A method of forming a semiconductor device, comprising:
   forming an active region in a semiconductor substrate;
   forming first and second patterns over the active region, the forming each of the first and second patterns including sequentially stacking a conductive pattern and a mask pattern;
   forming a first insulating layer around the first and second patterns to expose the first and second patterns;
   forming a connection pattern in the first insulating layer in a region between the first and second patterns, the connection pattern being electrically connected to the active region;
   sequentially forming second and third insulating layers on the connection pattern; and
   etching the third insulating layer at least twice and the second insulating layer at least once to form a through hole, the connection pattern being surrounded by at least one of the second and third insulating layers, the first to third insulating layers having different etch rates from each other, and the second insulating layer being a different material from the mask pattern, and a diameter of the through hole in a lower portion of the third insulating layer being greater than a diameter of the through hole in an upper portion of the third insulating layer.

7. The method of claim 6, wherein:
the mask pattern includes one of aluminum and silicon, and nitrogen,
the first insulating layer includes silicon and oxygen,
the second insulating layer includes one of aluminum and silicon, and nitrogen, and is formed to cover the first and second patterns, the connection pattern and the first insulating layer, and
the conductive pattern and the connection pattern include conductive material.

8. The method of claim 7, wherein:
the third insulating layer includes one of a first insulating material having a concentration gradient of impurity ions along a thickness direction perpendicular to a top surface thereof, and second insulating materials stacked sequentially toward the top surface thereof, and
the third insulating layer has a greater etch rate at a lower portion of the third insulating layer than an upper portion thereof.

9. The method of claim 8, wherein the etching the third insulating layer at least twice and the second insulating layer at least once to form a through hole step includes:
forming a photoresist layer on the third insulating layer, the photoresist layer having an opening aligning the connection pattern and exposing the third insulating layer;
etching the third insulating layer through the opening using the photoresist layer as an etch mask to form a first preliminary through hole in the third insulating layer, the first preliminary through hole having substantially a same diameter along a thickness direction perpendicular to the top surface of the third insulating layer, and the first preliminary through hole exposing the second insulating layer;
removing the photoresist layer from the semiconductor substrate;
etching a lower portion of the third insulating layer through the first preliminary through hole using the third insulating layer as an etch mask to form a second preliminary through hole, the second preliminary through hole having a diameter D2 in the lower portion of the third insulating layer, and a diameter D1 in an upper portion of the third insulating layer, wherein D2>D1; and
etching the second insulating layer through the second preliminary through hole using the third insulating layer as an etch mask to form the through hole exposing the connection pattern.

10. The method of claim 9, wherein:
the first preliminary through hole is formed by applying a dry etchant to the third insulating layer,
the second preliminary through hole is formed by applying one selected from wet and dry etchants to the third insulating layer, and
the through hole is formed by applying one selected from wet and dry etchants to the second insulating layer.

11. The method of claim 10, wherein the wet etchant applied to the second insulating layer includes one of $H_2SO_4$, $H_3PO_4$, and SC-1 or a combination of $H_2SO_4$ and SC-1.

12. The method of claim 6, wherein:
the mask pattern includes one of aluminum and silicon, and nitrogen,
the first insulating layer includes silicon and oxygen,
the second insulating layer includes one of aluminum and silicon, and nitrogen, and is formed to cover the connection pattern, and
the conductive pattern and the connection pattern include conductive material.

13. The method of claim 12, wherein:
the third insulating layer includes one of a first insulating material having a concentration gradient of impurity ions along a thickness direction perpendicular to a top surface thereof, and second insulating materials stacked sequentially toward the top surface thereof, and
the third insulating layer has a greater etch rate at a lower portion of the third insulating layer than an upper portion thereof.

14. The method of claim 13, wherein the etching the third insulating layer at least twice and the second insulating layer at least once to form a through hole step includes:
forming a photoresist layer on the third insulating layer, the photoresist layer having an opening aligning the connection pattern and exposing the third insulating layer;
etching the third insulating layer through the opening using the photoresist layer as an etch mask to form a first preliminary through hole in the third insulating layer, the first preliminary through hole having substantially a same diameter along a thickness direction perpendicular to the top surface of the third insulating layer, and the first preliminary through hole exposing the second insulating layer;
removing the photoresist layer from the semiconductor substrate;
etching a lower portion of the third insulating layer through the first preliminary through hole using the third insulating layer as an etch mask to form a second preliminary through hole, the second preliminary through hole having a diameter D2 in the lower portion of the third insulating layer, and a diameter D1 in an upper portion of the third insulating layer, wherein D2>D1; and
etching the second insulating layer through the second preliminary through hole using the third insulating layer as an etch mask to form the through hole exposing the connection pattern.

15. The method of claim 14, wherein:
the first preliminary through hole is formed by applying a dry etchant to the third insulating layer,
the second preliminary through hole is formed by applying one selected from wet and dry etchants to the third insulating layer, and
the through hole is formed by applying one selected from wet and dry etchants to the second insulating layer, and if the dry etchant is applied to the second insulating layer, the dry etchant includes one of $H_2SO_4$, $H_3PO_4$, and SC-1 or combination of $H_2SO_4$ and SC-1.

16. A method of forming a semiconductor module, comprising:
preparing a module substrate and at least one semiconductor package structure; and
electrically connecting the module substrate to the at least one semiconductor package structure, wherein the at least one semiconductor package structure has a semiconductor device including a semiconductor cell structure, the method of forming the semiconductor cell structure comprising:
forming first and second patterns over a semiconductor substrate, the forming each of the first and second patterns including sequentially stacking a conductive pattern and a mask pattern;
forming a first insulating layer surrounding the first and second patterns;
forming a connection pattern in the first insulating layer in a region between the first and second patterns;

sequentially forming second and third insulating layers on the connection pattern; and etching the third insulating layer at least twice and the second insulating layer at least once to form a through hole, the through hole being surrounded by at least one of the second and third insulating layers, and a diameter of the through hole in a lower portion of the third insulating layer being greater than a diameter of the through hole in an upper portion of the third insulating layer.

17. The method of claim 16, wherein:
the mask pattern includes silicon and nitrogen,
the first insulating layer includes silicon and oxygen,
the second insulating layer includes aluminum and nitrogen, and is formed to cover the first and second patterns, the connection pattern, and the first insulating layer,
the third insulating layer includes an insulating material having a concentration gradient of impurity ions along a thickness direction perpendicular to a top surface thereof, and
the conductive pattern and the connection pattern include conductive material.

18. The method of claim 17, wherein the etching the third insulating layer at least twice and the second insulating layer at least once to form a through hole step includes:
forming a photoresist layer on the third insulating layer, the photoresist layer having an opening aligning the connection pattern and exposing the third insulating layer;
etching the third insulating layer through the opening using the photoresist layer as an etch mask to form a first preliminary through hole in the third insulating layer, the first preliminary through hole having substantially a same diameter along a thickness direction perpendicular to the top surface of the third insulating layer, and the first preliminary through hole exposing the second insulating layer;
removing the photoresist layer from the semiconductor substrate;
etching a lower portion of the third insulating layer through the first preliminary through hole using the third insulating layer as an etch mask to form a second preliminary through hole, the second preliminary through hole having a diameter D2 in the lower portion of the third insulating layer, and a diameter D1 in an upper portion of the third insulating layer, wherein D2>D1; and
etching the second insulating layer through the second preliminary through hole using the third insulating layer as an etch mask to form the through hole exposing the connection pattern.

19. The method of claim 16, wherein:
the mask pattern includes silicon and nitrogen,
the first insulating layer includes silicon and oxygen,
the second insulating layer includes aluminum and nitrogen, and is formed to cover the connection pattern,
the third insulating layer includes an insulating material having a concentration gradient of impurity ions along a thickness direction perpendicular to a top surface thereof, and
the conductive pattern and the connection pattern include conductive material.

20. The method of claim 19, wherein the etching the third insulating layer at least twice and the second insulating layer at least once to form a through hole step includes:
forming a photoresist layer on the third insulating layer, the photoresist layer having an opening aligning the connection pattern and exposing the third insulating layer;
etching the third insulating layer through the opening using the photoresist layer as an etch mask to form a first preliminary through hole in the third insulating layer, the first preliminary through hole having substantially a same diameter along a thickness direction perpendicular to the top surface of the third insulating layer, and the first preliminary through hole exposing the second insulating layer;
removing the photoresist layer from the semiconductor substrate;
etching a lower portion of the third insulating layer through the first preliminary through hole using the third insulating layer as an etch mask to form a second preliminary through hole, the second preliminary through hole having a diameter D2 in the lower portion of the third insulating layer, and a diameter D1 in an upper portion of the third insulating layer, wherein D2>D1; and
etching the second insulating layer through the second preliminary through hole using the third insulating layer as an etch mask to form the through hole exposing the connection pattern.

* * * * *